(12) United States Patent
Tanaka

(10) Patent No.: US 8,547,630 B2
(45) Date of Patent: Oct. 1, 2013

(54) OPTICAL SEMICONDUCTOR DEVICE AND MANUFACTURING METHOD THEREFOR

(75) Inventor: Shinsuke Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 289 days.

(21) Appl. No.: 12/498,425

(22) Filed: Jul. 7, 2009

(65) Prior Publication Data
US 2010/0007944 A1    Jan. 14, 2010

(30) Foreign Application Priority Data
Jul. 10, 2008  (JP) ................................ 2008-180554

(51) Int. Cl.
H01S 5/00        (2006.01)

(52) U.S. Cl.
USPC ........................................................ 359/344

(58) Field of Classification Search
USPC ........................................................ 359/344
See application file for complete search history.

(56) References Cited

U.S. PATENT DOCUMENTS

| | | | |
|---|---|---|---|
| 6,046,842 A * | 4/2000 | Tiemeijer | 359/344 |
| 6,310,720 B1 * | 10/2001 | Walker et al. | 359/344 |
| 6,775,316 B2 * | 8/2004 | Vakhshoori et al. | 372/109 |
| 7,099,535 B2 * | 8/2006 | Bhagavatula et al. | 385/33 |
| 2002/0176476 A1 * | 11/2002 | Vakhshoori et al. | 372/101 |
| 2003/0161379 A1 * | 8/2003 | Wolak et al. | 372/108 |
| 2003/0215181 A1 | 11/2003 | Lee | |
| 2005/0163438 A1 | 7/2005 | Sander et al. | |
| 2007/0091411 A1 | 4/2007 | Mori et al. | |

FOREIGN PATENT DOCUMENTS

| | | |
|---|---|---|
| EP | 1 317 034 A2 | 6/2003 |
| JP | 2005-518097 A | 6/2005 |

OTHER PUBLICATIONS

Zainal, et al. "The comparative study of optical fiber coupling scheme in pigtailing of Semiconductor Optical Amplifiers", Optical Design and Engineering III, Proceedings of SPIE vol. 7100, 71001T, (2008).*
T. Toyonaka et al., "22dB Gain Semiconductor Optical Amplifier Module Using High Numerical Aperture Aspheric Lenses", Electronics Letters, Jul. 2, 1992, pp. 1302-1303, vol. 28, No. 14.
European Office Action dated Nov. 23, 2012, issued in corresponding European Patent Application No. 09164138.1-2217 (4 pages).
Extended European Search Report dated Aug. 8, 2011, issued in corresponding European Patent Application No. 09164138.1-2216 (5 pages).
Kennedy B.F. et al., "Investigation of polarization dependent gain dynamics in a bulk SOA", Optics Communications, North-Holland Publishing Co. Amsterdam, NL, vol. 272, No. 2, Feb. 24, 2007, pp. 490-495, XP005905051.B.

(Continued)

*Primary Examiner* — Eric Bolda
(74) *Attorney, Agent, or Firm* — Westerman, Hattori, Daniels & Adrian, LLP

(57) ABSTRACT

A manufacturing method for an optical semiconductor device, including disposing a semiconductor element that has a polarization dependent gain or polarization dependent loss between optical waveguide modes differing in the direction of polarization, positioning a lens at one end face side of the semiconductor element based on an optical coupling loss between the lens and the semiconductor element, and repositioning the lens based on the polarization dependent gain or the polarization dependent loss of the semiconductor element.

11 Claims, 18 Drawing Sheets

(56) References Cited

OTHER PUBLICATIONS

Antoniades N. et al., "The Impact of Polarization-Dependent Gain on the Design of Cascaded Semiconductor Optical Amplifier CWDM Systems", IEEE Photonics Technology Letters, IEEE Service Center, Piscataway, NJ, US, vol. 18, No. 20, Oct. 1, 2006, pp. 2099-2101, XP011149314.

\* cited by examiner

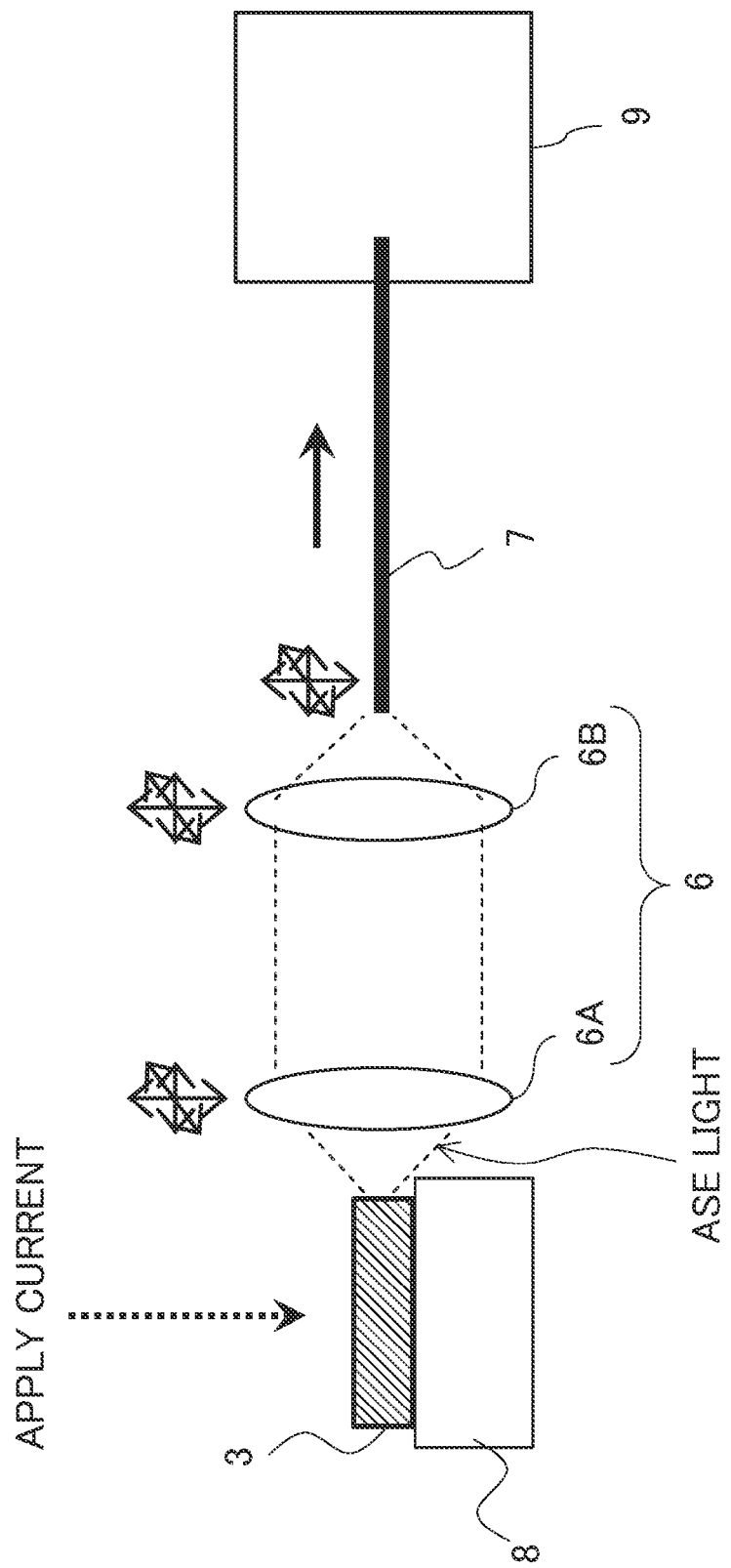

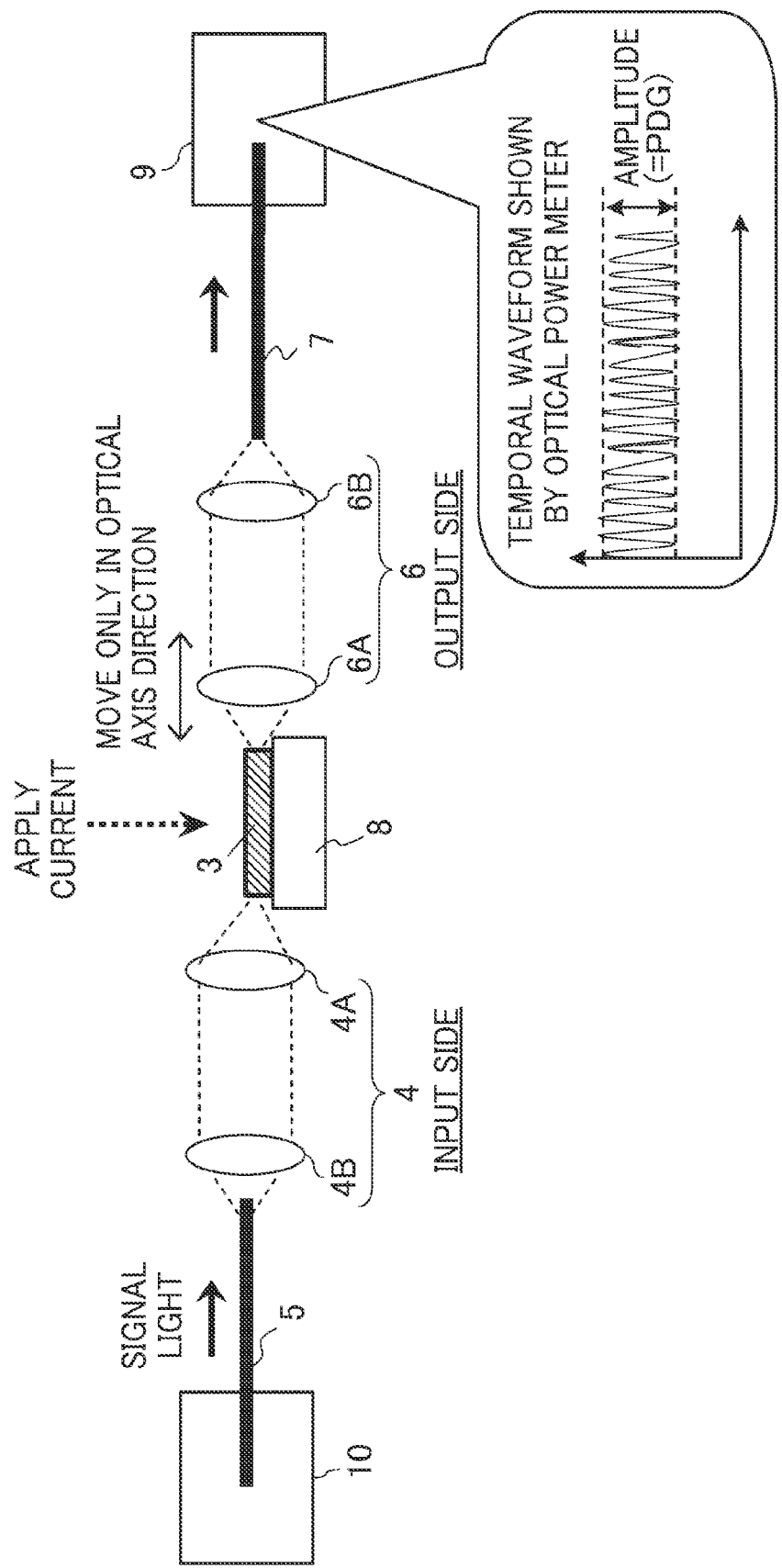

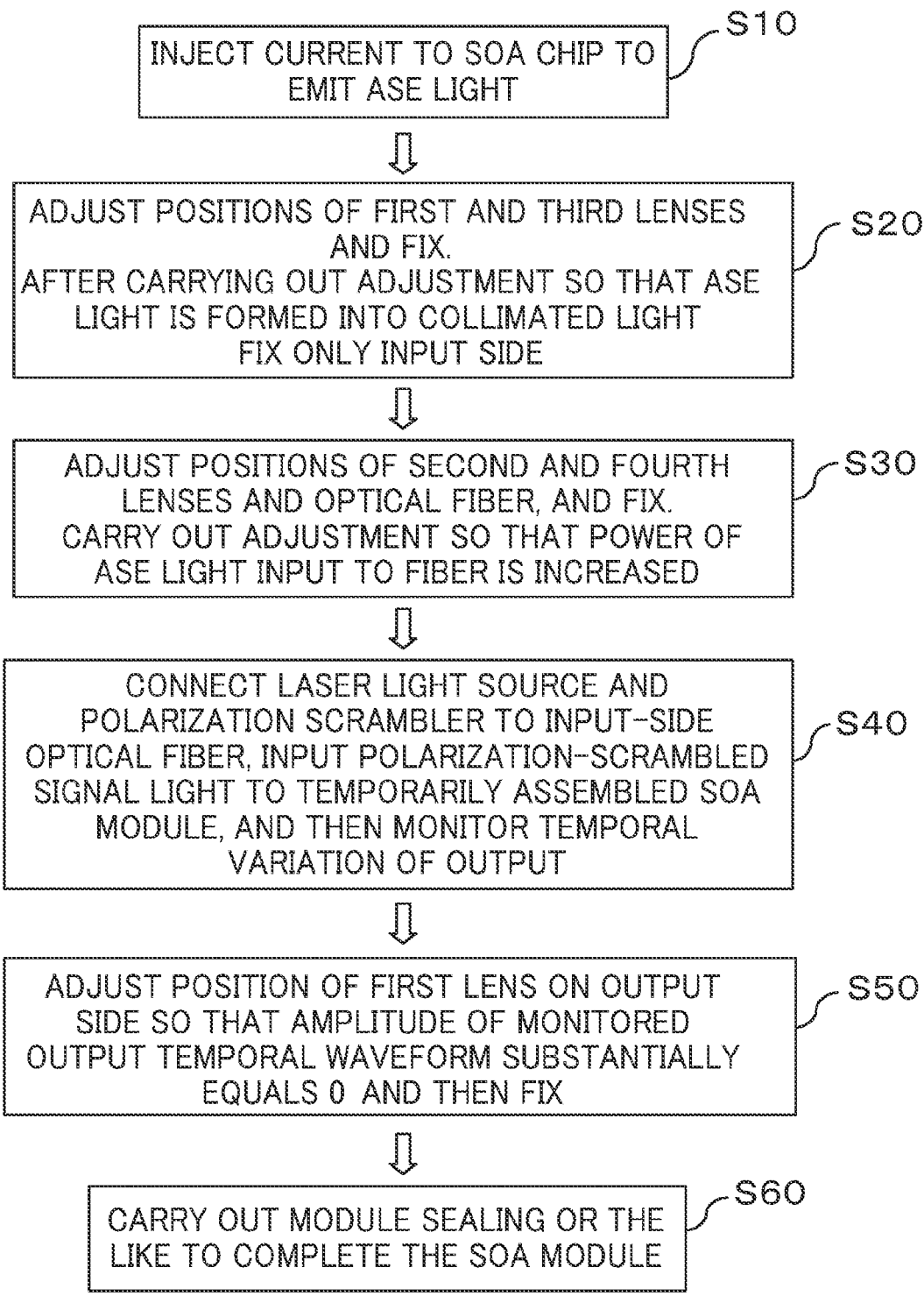

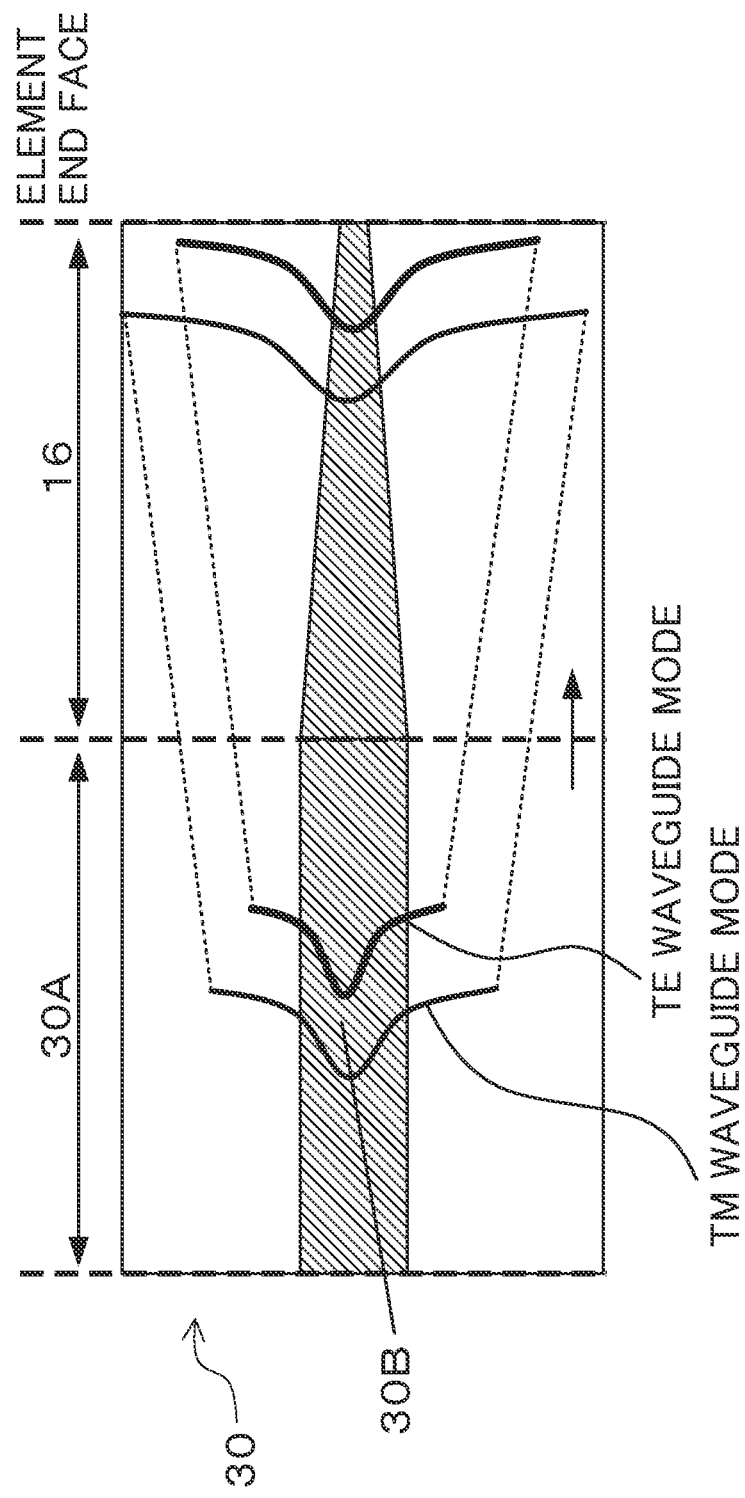

OPTICAL SEMICONDUCTOR DEVICE AND MANUFACTURING METHOD THEREFOR

CROSS REFERENCE TO RELATED APPLICATION

This application is based upon and claims the benefit of priority from prior Japanese Patent Application No. 2008-180554, filed on Jul. 10, 2008, the entire contents of which are incorporated herein by reference.

FIELD

The present invention relates to an optical semiconductor device and a manufacturing method therefor.

BACKGROUND

With the recent dramatic increase in demand in communications, high-capacity, high-speed photonic network applications have spread to the extent that even metro access systems are accessible to subscribers.

An optical module provided with a semiconductor optical amplifier (SOA) (SOA module) has a dramatically simplified structure compared to the currently popular optical module provided with an optical fiber amplifier (optical fiber amplifier module). The optical module (SOA module) allows for greater miniaturization and price reduction, and application to the next-generation access network and data communications is under consideration.

An SOA module may be equipped with, for example, an input-side optical fiber, an input-side lens system, an SOA chip, an output-side lens system, and an output-side optical fiber. Signal light is input to the input-side optical fiber, optically coupled to the SOA chip through the input-side lens system, amplified in the SOA chip, optically coupled to the output-side optical fiber through the output-side lens system, and then output from the output-side optical fiber.

In an optical network, the signal light input to the SOA module is not always polarized in the same way, and the polarization state varies with time.

Therefore, for the SOA module having input signal light with a constant intensity to always output signal light with a constant intensity, the SOA module needs to have an optical gain that does not vary with the polarization of the input signal light.

SUMMARY

According to an aspect of the invention, a manufacturing method for an optical semiconductor device, including disposing a semiconductor element that has a polarization dependent gain (PDG) or polarization dependent loss (PDL) between optical waveguide modes differing in the direction of polarization, positioning a lens at one end face side of the semiconductor element based on an optical coupling loss between the lens and the semiconductor element, and repositioning the lens based on the polarization dependent gain or the polarization dependent loss of the semiconductor element.

According to an another aspect of the invention, an optical semiconductor device, includes a semiconductor element that provides different spot sizes on an element end face for optical waveguide modes differing in the direction of polarization, and a lens positioned at one end face side of the semiconductor element, wherein a spot size at a beam waist position of the lens is smaller than a spot size in either of the optical waveguide modes.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 is a diagram illustrating positional adjustment based on the optical power in a manufacturing method for the optical semiconductor device (SOA module) according to the first embodiment of the present invention;

FIGS. 5A and 5B are diagrams illustrating the manufacturing method for the optical semiconductor device (SOA module) according to the first embodiment of the present invention;

FIG. 6 is a flowchart illustrating processes of the manufacturing method for the optical semiconductor device (SOA module) according to the first embodiment of the present invention;

FIG. 10 is a diagram illustrating another configuration of a semiconductor element (SOA chip) of the optical semiconductor device (SOA module) according to the embodiments of the present invention;

DESCRIPTION OF EMBODIMENTS

An SOA module that has a polarization-independent optical gain is provided.

If the polarization dependent gain (PDG) of the SOA chip in an SOA module is reduced, the SOA module may have a polarization-independent optical gain.

However, in many cases, because of variations in crystal growth conditions and process conditions during manufacture of SOA chips, the PDG of the SOA chips, which may have a maximum magnitude of several dB, varies with the wafer or within a wafer by several dB.

Such variations of the PDG of the SOA chips are hard to control, and therefore, it is difficult to stably manufacture SOA chips having a low PDG. Accordingly, it is also difficult to stably manufacture SOA modules that achieve a low PDG, and thus, it is difficult to stably provide SOA modules that achieve a polarization-independent optical gain.

The problem concerns not only the SOA module having the SOA chip described above but also an optical module that includes a semiconductor element having a PDG or polarization dependent loss (PDL) that varies with the semiconductor element and needs to have stable polarization-independent characteristics.

In the following, optical semiconductor devices and manufacturing methods therefor according to embodiments of the present invention will be described with reference to the drawings.

First Embodiment

First, an optical semiconductor device and a manufacturing method therefor according to a first embodiment will be described with reference FIGS. 1 to 6.

In this embodiment, as a manufacturing method for an optical semiconductor device, a manufacturing method for a semiconductor optical amplifier (SOA) module (an optical module) will be described, for example.

Figure 1:
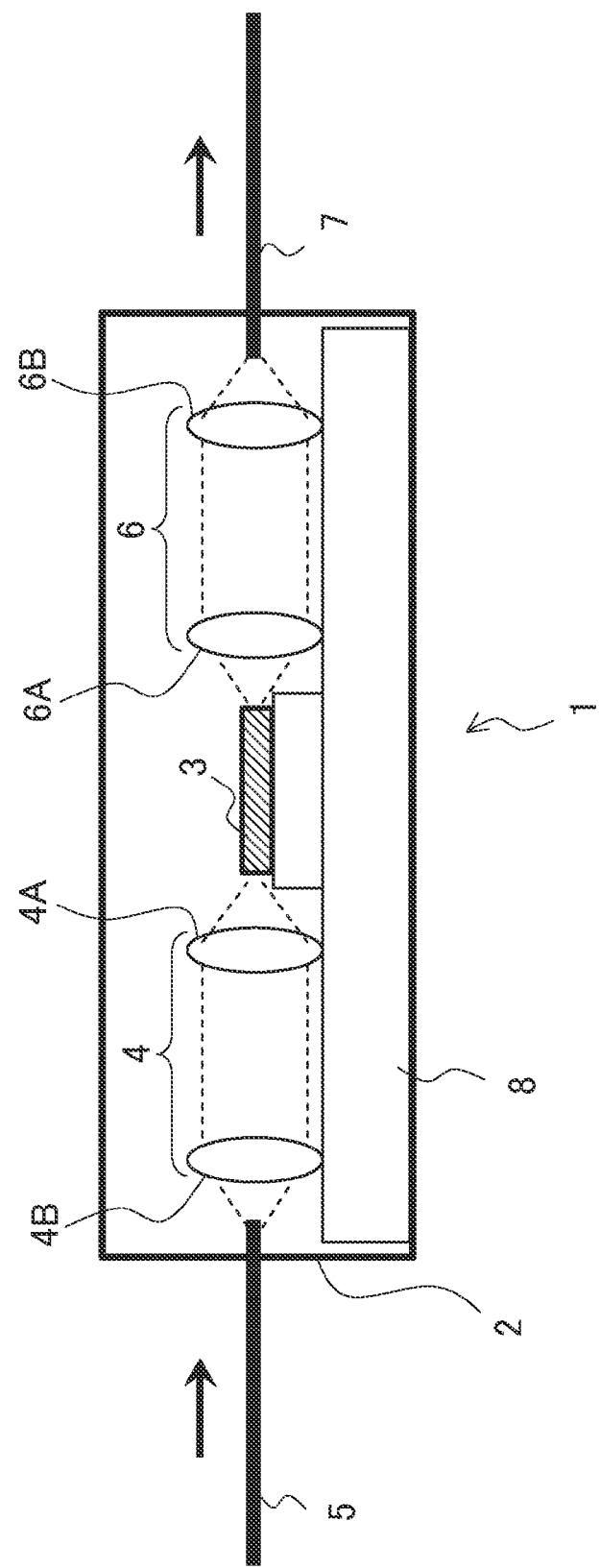
FIG. 1 is a diagram illustrating a configuration of an optical semiconductor device (SOA module) according to a first embodiment of the present invention.

As illustrated in FIG. 1, an SOA module 1 has a module housing 2, an SOA chip 3 disposed in the module housing 2, an input-side lens system 4 disposed on the input side of the SOA chip 3, an input-side optical fiber 5 optically coupled to an input port of the SOA chip 3 by the input-side lens system 4, an output-side lens system 6 disposed on the output side of the SOA chip 3, and an output-side optical fiber 7 optically coupled to an output port of the SOA chip 3 by the output-side lens system 6. In FIG. 1, reference numeral 8 denotes a stage.

The SOA chip (semiconductor device, optical device) 3 has a port to which signal light is input at an input end face of an optical waveguide and a port from which signal light is output at an output end face of the optical waveguide. The SOA chip 3 amplifies the intensity of the input signal light by stimulated emission that is generated in an active layer in the chip.

In the manufacturing method for the SOA module according to this embodiment, the SOA module 1 is manufactured as described below.

First, the SOA chip 3, the input-side lens system (one lens system) 4, the output-side lens system (the other lens system) 6, the input-side optical fiber 5 (one optical fiber), and the output-side optical fiber 7 (the other optical fiber) are provided (see FIG. 1).

Figure 3A:
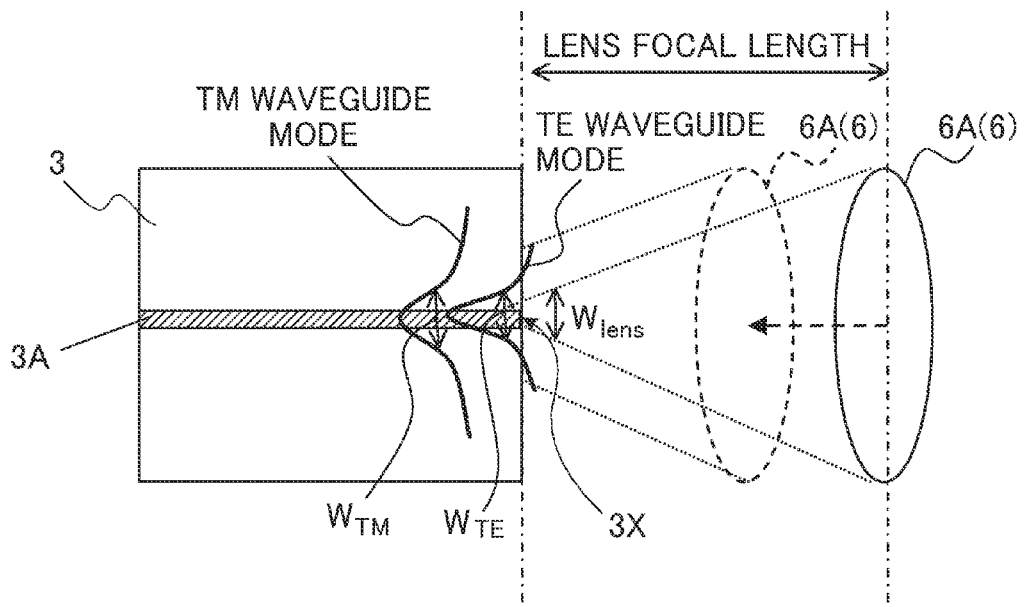
FIGS. 3A and 3B are diagrams illustrating compensation for a PDG of an SOA chip in the manufacturing method for the optical semiconductor device (SOA module) according to the first embodiment of the present invention.

An SOA chip 3 is provided that differs in spot size on the chip end face (element end face) between optical waveguide modes differing in the direction of polarization (see FIG. 3A). In this embodiment, polarization is represented as two orthogonal polarization states: the transverse electric (TE) mode and the transverse magnetic (TM) mode. That is, an SOA chip that has a polarization dependent gain in the optical waveguide modes differing in the direction of polarization is provided.

An output side lens system 6 is configured so that a spot size at a beam waist position smaller than the spot size on the end face of the SOA chip 3 for respective optical waveguide modes (the TE mode and the TM mode in this embodiment) (see FIG. 3A). In this embodiment, the output side lens system 6 includes a first lens 6A and a second lens 6B.

The input-side lens system 4 may be a lens system capable of optically coupling signal light input through the input-side optical fiber 5 to the SOA chip 3 to reduce the optical coupling loss. In this embodiment, the input side lens system 4 includes a third lens 4A and a fourth lens 4B.

The input-side lens system 4 and the input-side optical fiber 5 are disposed on the side of the input end face of the SOA chip 3, and the output-side lens system 6 and the output-side optical fiber 7 are disposed on the output side end face of the SOA chip 3 (see FIG. 1).

In this embodiment, in order from the closest to the SOA chip 3 to the furthest away from the SOA chip 3, the first lens 6A is disposed at the side of the output end face of the SOA chip 3 closest to the SOA chip 3, the second lens 6B is disposed next to the first lens 6A, and the output-side optical fiber 7 is disposed next to the second lens 6B and furthest away from the SOA chip 3. On the side of the input end face of the SOA chip 3, in order from closest to the SOA chip 3 to furthest away from the SOA chip 3, the third lens 4A is disposed next to the SOA chip 3, the fourth lens 4B is disposed next to the third lens 4A, and the input-side optical fiber 5 is disposed next to the fourth lens 4B and furthest away from the SOA chip 3 (see FIG. 1).

As illustrated in FIG. 2, an optical power meter 9 is connected to both the input-side optical fiber 5 and the output-side optical fiber 7. The positions of the input-side lens system 4, the output-side lens system 6, the input-side optical fiber 5, and the output-side optical fiber 7 are adjusted to increase the power of the light coupled from the end faces of the SOA chip 3 to the input-side optical fiber 5 and the output-side optical fiber 7 via the input-side lens system 4 and the output-side lens system 6, respectively (that is, to reduce the optical coupling loss). In FIG. 2, for convenience of explanation, only the output side is illustrated, and illustration of the input side is omitted.

In this embodiment, as illustrated in FIG. 2, by applying a current to the SOA chip 3 to make the SOA chip 3 emit amplified spontaneous emission (ASE) light from both end faces, the positions of the first lens 6A, the second lens 6B, and the output-side optical fiber 7 are adjusted to increase the power of the light coupled to the output-side optical fiber 7 via the first lens 6A and the second lens 6B in the output-side lens system 6.

Similarly, the positions of the input-side lens system 4 and the input-side optical fiber 5 are adjusted to increase the power of the light coupled to the input-side optical fiber 5 via the third lens 4A and the fourth lens 4B in the input-side lens system 4.

After the positions are adjusted, the components other than the first lens 6A, the input-side lens system 4, the input-side optical fiber 5, the second lens 6B, and the optical-side optical fiber 7, are fixed (see FIG. 1).

The PDG of the SOA chip 3 (which is an indicator of the polarization dependency of the optical gain of the SOA chip 3) is defined as the difference between the maximum gain and the minimum gain of the SOA chip 3 for input signal light in various polarization states. In general, for the SOA chip 3, one of the two orthogonal linear polarization modes TE and TM is associated with the maximum PDG, and the other is associated with the minimum PDG. Thus, the PDG is expressed as PDG=|(TE gain)−(TM gain)|.

Furthermore, the PDG of the SOA module 1 is determined by totaling the PDG of the SOA chip 3 installed in the SOA module 1 and the inter-polarization difference in optical coupling loss between the SOA chip 3 and the input-side optical fiber 5 or the output-side optical fiber 7 (which is an indicator of the polarization dependency of the optical coupling loss between the SOA chip 3 and the optical fiber 5 and 7).

In general, the PDG of the SOA chip 3 has a greater influence. And because of variations in crystal growth conditions and process conditions during manufacture of SOA chips, the PDG of SOA chips, which may have a maximum magnitude of several dB, varies between wafers or within a wafer by several dB.

Thus, in this embodiment, after the positions are adjusted based on the optical power as described above, positional adjustment is carried out by displacing the output-side lens system 6 (the first lens 6A in this embodiment) in an optical axis direction so that the inter-polarization difference in optical coupling loss between the SOA chip 3 and the output-side optical fiber 7 is suitable for compensation for the PDG of the SOA chip 3 (see FIG. 3A).

That is, in this embodiment, in the optical coupling adjustment process (lens system adjustment process) during manufacture of the SOA module, the first lens 6A that has been positioned to reduce the optical coupling loss as described above is intentionally shifted in the optical axis direction (see FIG. 3A).

For example, even if the focal position of the output-side lens system 6 has been adjusted to be adjusted to the position of the output end face of the SOA chip 3 by the first positional adjustment of the output-side lens system 6 described above (see the position depicted by the solid line in FIG. 3A), the focal position of the output-side lens system 6 shifts from the position of the output end face of the SOA chip 3 due to the second positional adjustment of the output-side lens system 6 (see the position depicted by the broken line in FIG. 3A).

As a result, an optical coupling loss may occur in the SOA module 1. However, the inter-polarization difference in optical coupling loss between the SOA chip 3 and the output-side optical fiber 7 can be adjusted.

After the positional adjustment based on the PDG of the SOA chip 3 is carried out, the first lens 6A is fixed (see FIG. 1).

In this way, a polarization-independent SOA module that provides a polarization-independent optical gain, which is one of the optical amplification characteristics of the part of the SOA module 1 between the input-side optical fiber 5 and the output-side optical fiber 7, can be manufactured.

Next, a principle of compensating for a variation of the PDG of the SOA chip 3 by adjusting the inter-polarization difference in optical coupling loss between the SOA chip 3 and the output-side optical fiber 7 will be described.

In this embodiment, as described above, an SOA chip that differs in spot size on the chip end face between the TE mode and the TM mode is used as the SOA chip 3. The SOA chip also has different gains in the optical waveguide modes differing in the direction of polarization. Furthermore, a lens system that is configured to provide a spot size at a beam waist position smaller than the spot size on the end face of the SOA chip 3 in either the TE mode or the TM mode is used as the output-side lens system 6 (see FIG. 3A).

Therefore, when the focal position of the lens system 6, which is the position of the waist of the beam propagating through the lens system 6, is adjusted to the position of the end face of the SOA chip 3 (that is, when the distance between the lens 6A in the lens system 6 that is disposed at a position closest to a waveguide end face 3X of the SOA chip 3 and the waveguide end face 3X of the SOA chip 3 is equal to the lens focal length), on the waveguide end face 3X of the SOA chip 3, the spot size $W_{lens}$ of the beam propagating through the lens system 6 (spot size for the lens system 6), the spot size $W_{TE}$ of the beam guided through an SOA optical waveguide 3A in the TE waveguide mode, and the spot size $W_{TM}$ of the beam guided through the SOA optical waveguide 3A in the TM waveguide mode conform to the following relationship: $W_{lens} < W_{TE} < W_{TM}$.

When an SOA chip and an optical fiber are optically coupled to each other by a lens system, the optical coupling loss between the SOA chip and the optical fiber is proportional to the mode overlapping integral $\eta_{TE}$ for the propagation mode and the TE waveguide mode of the lens system on the end face of the SOA chip, or the mode overlapping integral $\eta_{TM}$ for the propagation mode and the TM waveguide mode of the lens system.

Thus, the optical coupling loss between the SOA chip and the optical fiber can be reduced by making the spot size of the lens system in the propagation mode and the spot size of the SOA chip in the TE waveguide mode and the TM waveguide mode close to or equal to each other.

For example, when the spot size of the beam guided through the SOA optical waveguide of the SOA chip differs between the TE waveguide mode and the TM waveguide mode, it can be assumed that the lens system is designed so that the spot size $W_{lens}$ of the lens system is approximately equal to the larger one of the spot size $W_{TE}$ for the TE waveguide mode or the spot size $W_{TM}$ for the TM waveguide mode (for example, $W_{lens} \approx W_{TE} > W_{TM}$).

Typically, since the focal position of the lens system is adjusted to the position of the end face of the SOA chip to reduce the optical coupling loss, the spot size $W_{lens}$ of the lens system on the end face of the SOA chip is or is close to the spot size at the beam waist position (the minimum spot size).

In this case, even if the lens system is displaced in the optical axis direction to adjust the distance of the lens system from the end face of the SOA chip, the size of the condensed light spot (the diameter of the beam condensed by the lens) cannot be smaller than the spot size at the beam waist position. Therefore, the relationship between the mode overlapping integrals $\eta_{TE}$ and $\eta_{TM}$ cannot be changed, and thus, the inter-polarization difference in optical coupling loss between the SOA chip and the optical fiber cannot be adjusted.

However, according to this embodiment, since the relationship $W_{lens} < W_{TE} < W_{TM}$ is met on the waveguide end face 3X when the position of the waist of the beam propagating through the lens system 6 is adjusted to the position of the end face of the SOA chip 3 (as depicted by the solid line in FIG. 3A), the inter-polarization difference in optical coupling loss between the SOA chip 3 and the optical fiber 7 can be adjusted by adjusting the distance of the lens system 6 from the waveguide end face 3X of the SOA chip 3 by displacing the first lens 6A in this embodiment in the optical axis direction as depicted by the broken line in FIG. 3A.

That is, although the spot sizes $W_{TE}$ and $W_{TM}$ of the SOA chip 3 in the TE mode and the TM mode are kept constant at the position of the end face of the SOA chip 3, the spot size $W_{lens}$ of the lens system 6 can be adjusted only by being increased (as depicted by the broken line in FIG. 3A). This is because the spot size of the light condensed by the lens system 6 increases when defocusing of the lens system 6 with respect to the end face of the SOA chip 3 is achieved by adjusting the distance of the first lens 6A in this embodiment from the end face of the SOA chip 3.

Figure 3B:
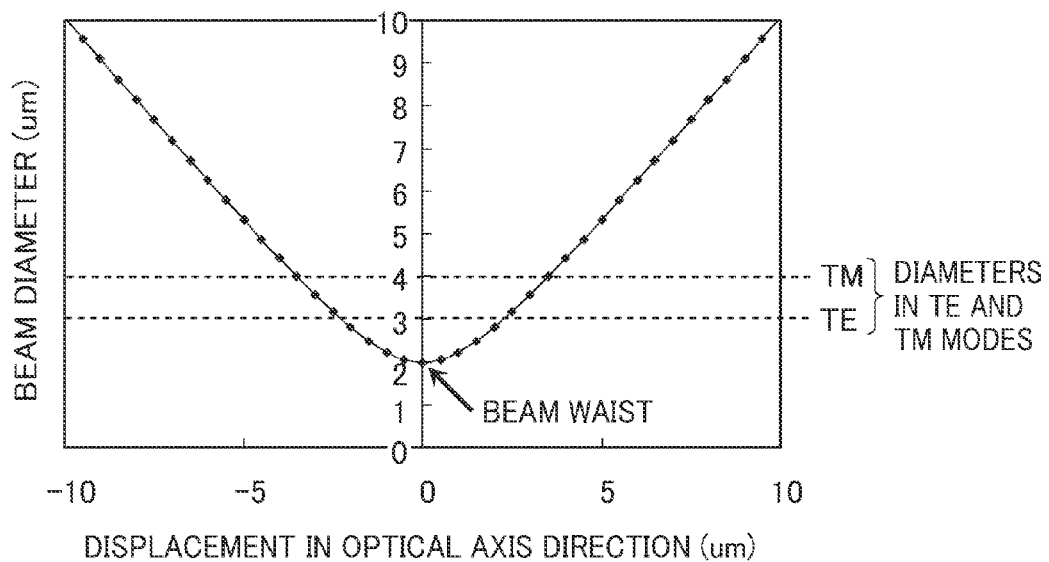

FIG. 3B is a graph of a relationship between the displacement of the lens system 6 from the focal position in the optical axis direction and the spot size of the beam from the optical fiber 7 condensed on the waveguide end face 3X of the SOA chip 3.

In FIG. 3B, an SOA chip 3 is used that has spot sizes (mode diameters) of substantially 3.0 μm and 4.0 μm on the waveguide end face 3X of the SOA chip 3 for the TE mode and the TM mode, respectively (the spot size is the diameter because the spot is substantially circular in this embodiment). In addition, in FIG. 3B, a lens system 6 is used that has a spot size of substantially 2.0 μm for the condensed beam (signal light) from the optical fiber 7 at the beam waist position.

As illustrated in FIG. 3B, as the displacement of the first lens 6A from the focal position in the optical axis direction increases, the spot size of the beam from the optical fiber 7 condensed on the waveguide end face 3X of the SOA chip 3 increases.

Therefore, the relationship $W_{lens} < W_{TE} < W_{TM}$ between the spot sizes on the waveguide end face 3X of the SOA chip 3 at the time when the beam waist position of the beam propagating through the lens system 6 is adjusted to the position of the end face of the SOA chip 3 can be changed into a relationship $W_{TE} < W_{lens} < W_{TM}$ and further into a relationship $W_{TE} < W_{TM} < W_{lens}$ by adjusting the distance of the lens system 6 (the first lens 6A in this embodiment) from the waveguide end face 3X of the SOA chip 3, as illustrated in FIGS. 3A and 3B.

Accordingly, the relationship $\eta_{TE} > \eta_{TM}$ of the overlapping integrals $\eta_{TE}$ and $\eta_{TM}$ between the TE waveguide mode of the SOA chip 3 and the propagation mode of the lens system 6, and between the TM waveguide mode of the SOA chip 3 and the propagation mode of the lens system 6 (in the case where the beam waist position of the beam propagating through the lens system 6 lies on the end face of the SOA chip 3) changes into a relationship $\eta_{TE} = \eta_{TM}$ or into a relationship $\eta_{TE} < \eta_{TM}$.

As described above, by adjusting the distance of the lens system (the first lens 6A in this embodiment) from the waveguide end face 3X of the SOA chip 3, the relationship between the mode overlapping integrals $\eta_{TE}$ and $\eta_{TM}$ may be changed. That is, by adjusting the distance of the lens system (the first lens 6A in this embodiment) from the waveguide end face 3X of the SOA chip 3, a state where the optical coupling loss for the TE mode is greater than the optical coupling loss for the TM mode may be changed into a state where the optical coupling loss for the TE mode is smaller than the optical coupling loss for the TM mode. Therefore, the inter-polarization difference in optical coupling loss between the SOA chip 3 and the optical fiber 7 can be adjusted.

The above states can be achieved only by making the spot size $W_{lens}$ of the lens system 6 on the end face of the SOA chip 3 smaller than the spot sizes $W_{TE}$ and $W_{TM}$ of the TE mode and the TM mode when the beam waist position of the beam propagating through the lens system 6 is adjusted to the position of the waveguide end face 3X of the SOA chip 3 as described above.

However, if the lens system is designed to satisfy the relationship $W_{lens} \approx W_{TE} > W_{TM}$ on the end face of the SOA chip when the beam waist position of the beam propagating through the lens system is adjusted to the position of the end face of the SOA chip as described above, only a relationship $W_{lens} > W_{TE} > W_{TM}$ can be achieved even if the distance of the lens system from the end face of the SOA chip is adjusted, and the relationship $\eta_{TE} > \eta_{TM}$ cannot be changed into the relationship $\eta_{TE} < \eta_{TM}$. Thus, the inter-polarization difference in optical coupling loss between the SOA chip and the optical fiber cannot be added by design.

Figure 4A:
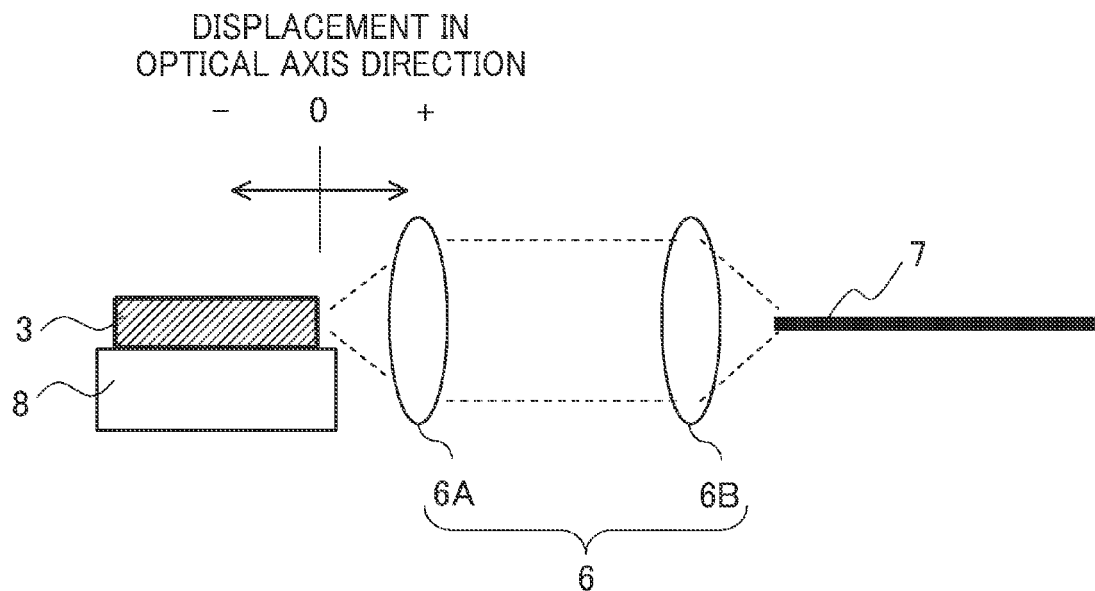
FIGS. 4A and 4B are diagrams illustrating a relationship between the displacement in an optical axis direction and the inter-polarization difference in optical coupling loss in positional adjustment based on the PDG of the SOA chip in the manufacturing method for the optical semiconductor device (SOA module) according to the first embodiment of the present invention.
Figure 4B:
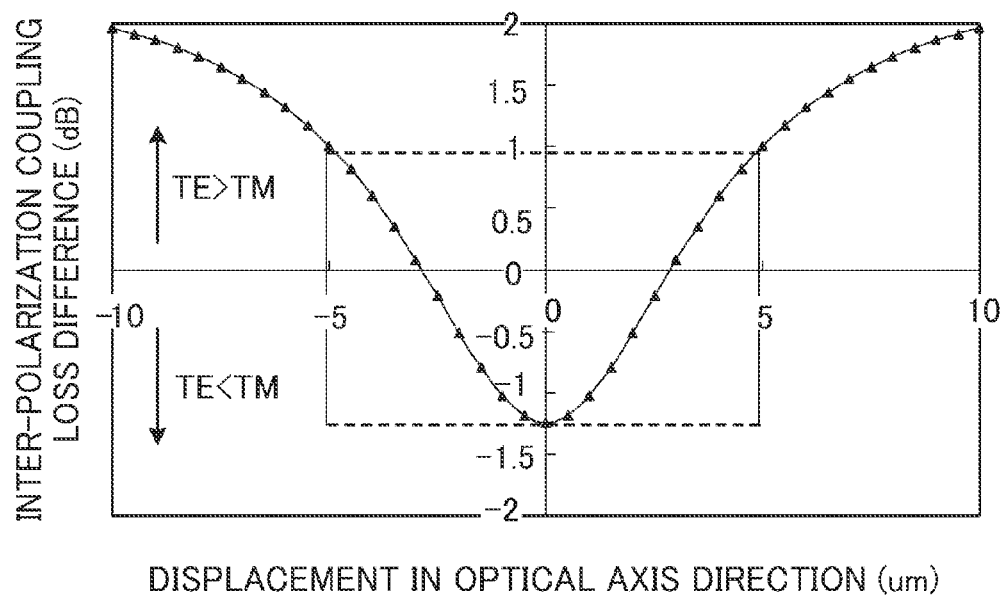

FIG. 4B illustrates a simulated result of the variation of the inter-polarization difference in optical coupling loss between the SOA chip 3 and the optical fiber 7 when the distance of the lens system 6 (the first lens 6A in this embodiment) from the waveguide end face 3X of the SOA chip 3 in the optical axis direction is changed. In FIG. 4B, the inter-polarization difference in optical coupling loss is assumed to be a positive value when TE>TM.

In this embodiment, an SOA chip 3 is used that provides spot sizes of substantially 3.0 μm and 4.0 μm on the end face for the TE mode and the TM mode respectively, and a lens system 6 is used that provides a spot size of substantially 2.0 μm for the condensed beam (signal light) from the optical fiber 7 at the beam waist position (the spot sizes are diameters since the spots are substantially circular).

In addition, as illustrated in FIG. 4A, the displacement in the optical axis direction is substantially zero when the beam waist position is adjusted to the position of the end face of the SOA chip 3 (that is, when the distance of the lens system 6 from the end face of the SOA chip 3 is substantially equal to the lens focal length), the displacement in the optical axis direction is assumed to be a positive value when the beam waist position is displaced to the output side from the end face of the SOA chip 3 (that is, when the distance of the lens system 6 (the first lens 6A in this embodiment) from the end face of the SOA chip 3 is longer than the lens focal length), and the displacement in the optical axis direction is assumed to be a negative value when the beam waist position is displaced to the input side from the end face of the SOA chip 3 (that is, when the distance of the lens system 6 (the first lens 6A in this embodiment) from the end face of the SOA chip 3 is shorter than the lens focal length).

As illustrated in FIG. 4B, if the beam waist position is displaced by ±5 μm from the position of the end face of the SOA chip 3 in the optical axis direction, a change in inter-polarization difference in optical coupling loss of substantially ±1 dB occurs. This means that the inter-polarization difference in optical coupling loss can be adjusted within a range of 1 dB in both the directions of TE>TM and TE<TM.

As can be seen from the simulated result, when the SOA chip 3 and the lens system 6 described above are used, the PDG of the SOA chip 3 can be compensated for within a range of substantially ±1 dB, and the SOA module 1 having a PDG of substantially 0 can be manufactured if the variations of the PDG of the SOA chip 3 falls within the above range.

As described above, by adjusting the inter-polarization difference in optical coupling loss between the SOA chip 3 and the output-side optical fiber 7, the PDG in the SOA chip can be cancelled, thereby compensating for a variation of the PDG of the SOA chip 3 and thus providing a SOA module 1 that achieves a low PDG, stably.

In the following, a specific example of the manufacturing method for the SOA module according to the present invention will be described with reference to FIGS. 5 and 6.

Figure 5A:
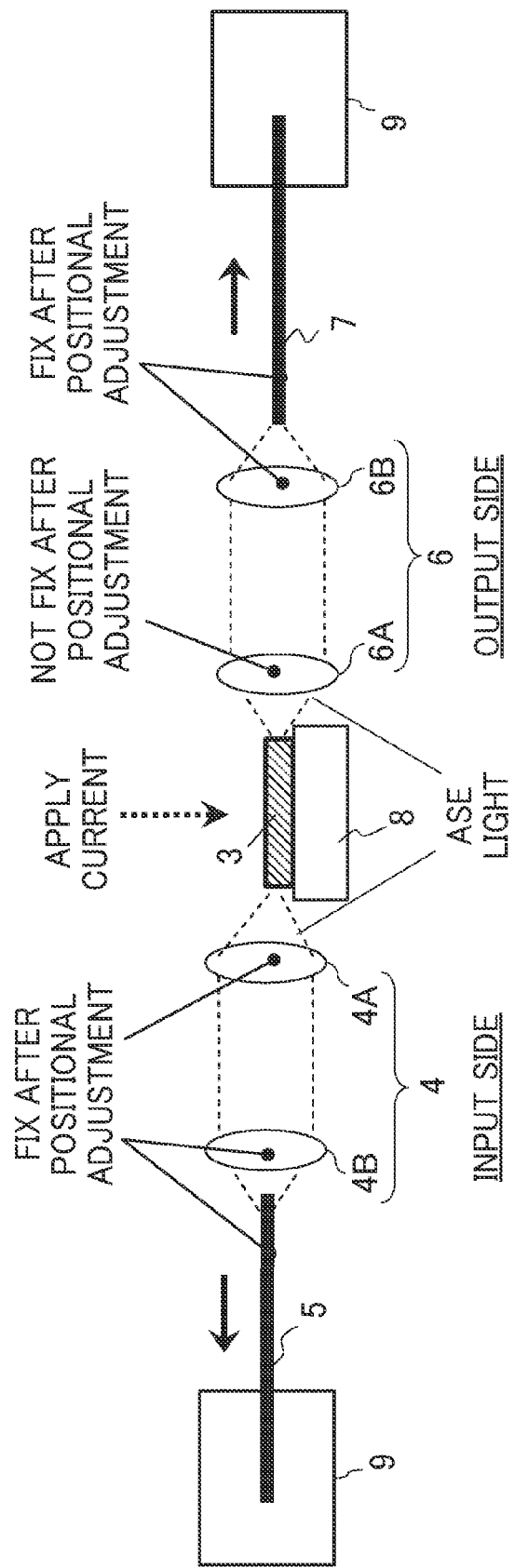

As illustrated in FIG. 5A, first, the SOA chip 3 is fixed on the stage (a temperature-controllable stage) 8, electrical wiring to energize the SOA chip 3 is installed, and then, a current is supplied to the SOA chip 3 to make the SOA chip 3 emit ASE light (amplified spontaneous emission light) from both of the end faces (S10 in FIG. 6).

Then, as illustrated in FIG. 5A, positional adjustment of the optical system is carried out to reduce the optical coupling loss between the SOA chip 3 and the input-side optical fiber 5 and the output-side optical fiber 7.

As illustrated in FIG. 5A, the input-side optical fiber 5 and the input-side lens system 4 are temporarily positioned on the input side of the SOA chip 3, and the output-side lens system 6 and the output-side optical fiber 7 are temporarily positioned on the output side of the SOA chip 3. Then, the positions of the lens systems 4 and 6 and the optical fibers 5 and 7 on both the input and the output side are adjusted to increase the power of the ASE light (the ASE light power) optically coupled from the end faces of the SOA chip 3 to the optical fibers 5 and 7 via the lens systems 4 and 6 (that is, to reduce the optical coupling loss between the SOA chip 3 and the optical fibers 5 and 7), and the input-side lens system 4, the input-side optical fiber 5, and the output-side optical fiber 7 are fixed (steps S20 and S30 in FIG. 6).

For example, when the input-side lens system 4 and the output-side lens system 6 each include two lenses as illustrated in FIG. 5A, the positions of the input-side lens system 4, the output-side lens system 6, the input-side optical fiber 5, and the output-side optical fiber 7 are adjusted, and the input-side lens system 4, the input-side optical fiber 5, and the output-side optical fiber 7 are fixed as described below.

In this embodiment, of the two lenses 6A and 6B in the output-side lens system 6, the lens disposed closer to the SOA chip 3 is referred to as the first lens 6A, and the lens disposed closer to the optical fiber 7 is referred to as the second lens 6B. Of the two lenses 4A and 4B in the input-side lens system 4, the lens disposed closer to the SOA chip 3 is referred to as the third lens 4A, and the lens disposed closer to the optical fiber 5 is referred to as the fourth lens 4B.

As illustrated in FIG. 5A, the first lens 6A in the output-side lens system 6 is temporarily positioned, and the position of the first lens 6A is adjusted so that the ASE light emitted from one end face of the SOA chip 3 is changed into collimated light by passing through the first lens 6A (S20 in FIG. 6). In S20, the first lens is not fixed.

Similarly, the third lens 4A in the input-side lens system 4 is temporarily positioned, and the position of the third lens 4A is adjusted so that the ASE light emitted from the other end face of the SOA chip 3 is changed into collimated light by passing through the third lens 4A. Then, the third lens 4A is fixed (S20 in FIG. 6).

As illustrated in FIG. 5A, the second lens 6B in the output-side lens system 6 and the output-side optical fiber 7 are temporarily positioned. The positions of the second lens 6B and the output-side optical fiber 7 are adjusted so that the collimated light formed by passing through the first lens 6A is optically coupled to the output-side optical fiber 7 with high efficiency, and then, the components are fixed (S30 in FIG. 6).

As illustrated in FIG. 5A, for example, the optical power meter 9 is connected to the output-side optical fiber 7, the positions of the second lens 6B and the output-side optical fiber 7 are adjusted to increase the intensity (power) of the ASE light introduced into the output-side optical fiber 7 by monitoring the intensity of the ASE light with the optical power meter 9, and the second lens 6B and the output-side optical fiber 7 are fixed (S30 in FIG. 6).

Similarly, the fourth lens 4B in the input-side lens system 4 and the input-side optical fiber 5 are temporarily positioned, the positions of the fourth lens 4B and the input-side optical fiber 5 are adjusted so that the collimated light formed by passing through the third lens 4A is optically coupled to the input-side optical fiber 5 with high efficiency, and the components are fixed (S30 in FIG. 6).

For example, the optical power meter 9 is connected to the input-side optical fiber 5, the positions of the fourth lens 4B and the input-side optical fiber 5 are adjusted to increase the intensity (power) of the ASE light introduced into the input-side optical fiber 5 by monitoring the intensity of the ASE light with the optical power meter 9, and the fourth lens 4B and the input-side optical fiber 5 are fixed (S30 in FIG. 6).

In this way, the SOA chip 3 is optically coupled to the input-side optical fiber 5 and the output-side optical fiber 7 via the input-side lens system 4 and the output-side lens system 6, respectively, in such a manner that the power of the ASE light coupled from the opposite end faces of the SOA chip 3 to the input-side optical fiber 5 and the output-side optical fiber 7 via the input-side lens system 4 and the output-side lens system 6, respectively, is increased.

Note that the procedure of adjusting the lens systems 4 and 6 is not limited to the procedure described above and may vary with the lens systems used.

If the positional adjustment is carried out to increase the power of the ASE light (if the positional adjustment is carried out based on the optical power), the optical coupling loss between the SOA chip 3 and the optical fibers 5 and 7 is reduced.

However, since the inter-polarization difference in optical coupling loss between the SOA chip 3 and the optical fibers 5 and 7 assumes a constant value that is determined by the optical waveguide mode of the SOA chip 3 and the design of the lens systems 4 and 6, the PDG of the SOA module 1 varies because of the variations of the PDG of the SOA chip 3.

Thus, in this embodiment, to compensate for variations of the PDG of the SOA chip 3 during assembly of the module to provide a SOA module 1 having a low PDG, positional re-adjustment based on the PDG of the SOA chip 3 is additionally carried out as described below.

In this embodiment, after the positional adjustment to increase the power of the ASE light is carried out as described above, further positional adjustment is carried out by displacing the first lens 6A in the output-side lens system 6 in the optical axis direction so that the inter-polarization difference in optical coupling loss between the SOA chip 3 and the output-side optical fiber 7 is suitable for compensation of the PDG of the SOA chip 3 (steps S40 and S50 in FIG. 6).

Note that, to enable such positional adjustment, the first lens 6A in the output-side lens system 6 is not fixed, while the input-side lens system 4 (optical system), the input-side optical fiber 5, the second lens 6B in the output-side lens system 6 (optical system), and the output-side optical fiber 7 are fixed by yttrium aluminum garnet (YAG) welding, ultra violet (UV) resin or the like.

The positional adjustment is carried out as follows.

As illustrated in FIG. 5B, the optical power meter 9 is removed from the input-side optical fiber 5, and a laser light source/polarization scrambler 10 is connected to the input-side optical fiber 5 (S40 in FIG. 6).

Then, polarization-scrambled signal light (including light in optical waveguide modes differing in the direction of polarization, by changing the polarization state of signal light over time) is input from the laser light source/polarization scrambler 10 to the temporarily assembled SOA module 1 via the input-side optical fiber 5 (S40 in FIG. 6).

The polarization-scrambled signal light is input to the SOA chip 3 via the input-side optical fiber 5 and the input-side lens system 4, amplified in the SOA chip 3 to which a current is supplied, and output to the optical power meter 9 connected to the output-side optical fiber 7 via the output-side lens system 6 and the output-side optical fiber 7.

As illustrated in FIG. 5B, the optical power meter 9 connected to the output-side optical fiber 7 monitors the temporal waveform of the intensity of the signal light amplified in the SOA chip 3 and output from the SOA module 1 (S40 in FIG. 6).

By monitoring the temporal waveform displayed by the optical power meter 9, the variations of the output (variations of the signal light intensity) corresponding to the rotation of the direction of polarization by the polarization scrambler can be monitored. Note that the peak to peak amplitude of the output waveform displayed by the optical power meter 9 indicates the PDG of the SOA module 1.

Then, while monitoring the temporal waveform displayed by the optical power meter 9, positional adjustment is carried out by displacing the first lens 6A in the output-side lens system 6 in the optical axis direction (that is, by changing the relationship between the beam waist position and the position of the output end face of the SOA chip 3) so that the peak to peak amplitude of the temporal waveform approximately equals 0 (that is, the PDG substantially equals 0), and then, the first lens 6A is fixed (S50 in FIG. 6). In summary, the signal light (including light in optical waveguide modes differing in the direction of polarization) output from the SOA chip 3 via the output-side lens system 6 is detected, and the first lens 6A is repositioned at a location where the PDG is reduced based on the detected light.

By such positional adjustment, the variations of the PDG of the SOA chip 3 can be compensated for based on the inter-polarization difference in optical coupling loss between the SOA chip 3 and the optical fiber 7.

Then, sealing of the module or the like is carried out to complete the SOA module 1 according to this embodiment (S60 in FIG. 6).

The SOA module 1 manufactured as described above has the configuration described below.

As illustrated in FIG. 1, the SOA module 1 according to this embodiment has the SOA chip 3 that differs in spot size on the chip end face (element end face) between optical waveguide modes differing in the direction of polarization, and having a PDG in optical waveguide modes differing in the direction of polarization. The optical fibers 5 and 7 are disposed at the opposite end faces of the SOA chip 3. In addition, the lens systems 4 and 6 are disposed at the opposite end faces of the SOA chip 3. The lens systems 4 and 6 optically couple the SOA chip 3 to the optical fibers 5 and 7, respectively.

Thus, the signal light introduced through the input-side optical fiber 5 is optically coupled to one end face of the optical waveguide of the SOA chip 3 by the input-side lens system 4, amplified in the SOA chip 3, output from the other end face of the optical waveguide of the SOA chip 3, and then optically coupled to the output-side optical fiber 7 by the output-side lens system 6.

In the SOA module 1 according to this embodiment, the output-side lens system 6 is configured to provide a spot size at the beam waist position smaller than the spot size in any of the optical waveguide modes.

In addition, the output-side lens system 6 is positioned so that the inter-polarization difference in optical coupling loss is suitable for compensation for the polarization dependent gain of the SOA chip 3. That is, the output-side lens system 6 is positioned at a location where the output-side lens system 6 may be displaced in the optical axis direction from the location where the distance between the output-side lens system 6 and the end face of the SOA chip 3 is equal to the focal length of the output-side lens system 6.

In this way, the output-side lens system 6 is positioned so that the spot size of the beam condensed by the output-side lens system 6 on the end face of the SOA chip 3 is smaller than the spot size of both of the optical waveguide modes or smaller than the spot size in either of the optical waveguide modes.

In addition, as illustrated in FIG. 1, in the SOA module 1 according to this embodiment, the SOA chip 3 is fixed on the temperature-controllable stage 8 that is capable of adjusting the temperature of the SOA chip 3 (including, for example, a thermistor and a thermoelectric cooler (TEC)).

Therefore, the optical semiconductor device (optical module) and the manufacturing method therefor according to this embodiment have an advantage that a stable polarization-independent optical gain can be achieved even when the PDG of the SOA chip 3 varies.

That is, according to the configuration of the optical semiconductor device and the manufacturing method therefor according to this embodiment, in the SOA module 1 including the SOA chip 3 that provides different shapes of guided light on the element end face for two orthogonal polarization states (the TE mode and the TM mode) and has some PDG, the PDG of the SOA chip 3 can be compensated for by adding an inter-polarization difference in optical coupling loss by positional adjustments of the lenses during manufacture of the module. Therefore, a small-size SOA module 1 having a stable and low PDG may be provided with a simple configuration without an additional optical component or mechanism.

Second Embodiment

Next, an optical semiconductor device and a manufacturing method therefor according to a second embodiment will be described with reference to FIGS. 7 and 8.

The optical semiconductor device (optical module; SOA module) and the manufacturing method therefor according to this embodiment differ from those according to the first embodiment described above, in which the inter-polarization difference in optical coupling loss is added only to the output-side, in that the inter-polarization difference in optical coupling loss is added to both the input side and the output side.

In the first embodiment described above, the PDG of the SOA chip 3 is compensated for by adding the inter-polarization difference in optical coupling loss only to the output-side of the SOA module 1. As a result, the SOA module 1 manufactured by the manufacturing method according to the first embodiment described above may have different characteristics depending on the direction of the input light.

However, in some applications of the SOA module 1, it may be preferable for the SOA module 1 to have constant characteristics independent of the direction of the input light. In such a case, the PDG of the SOA chip 3 can be compensated for by adding the inter-polarization difference in optical coupling loss both to the input side and the output side of the SOA module 1.

To achieve this, according to the manufacturing method for the SOA module according to this embodiment, an SOA module 1 is manufactured as follows.

Figure 7A:
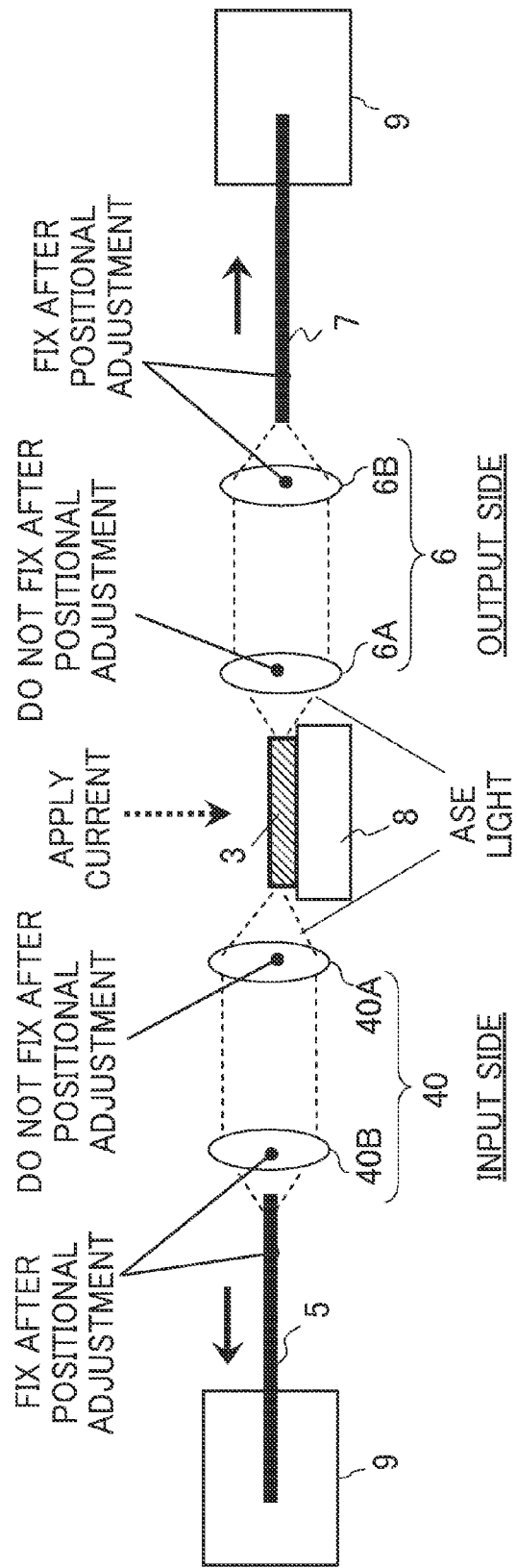
FIGS. 7A to 7C are diagrams illustrating a manufacturing method for an optical semiconductor device (SOA module) according to a second embodiment of the present invention.

First, an SOA chip (semiconductor device; optical device) 3, an input-side lens system (one lens system) 40, an output-side lens system (the other lens system) 6, an input-side optical fiber 5 and an output-side optical fiber 7 (one optical fiber and the other optical fiber) are provided (see FIG. 7A). Note that, in FIG. 7A, the same components as those in the first embodiment described above are denoted by the same reference numerals as those in the first embodiment.

Lens systems that provide spot sizes at a beam waist position smaller than the spot sizes on the end face of the SOA chip 3 in any of the optical waveguide modes (the TE mode and the TM mode in this embodiment) are provided as the input-side lens system 40 and the output-side lens system 6.

In this embodiment, the output-side lens system 6 includes a first lens 6A and a second lens 6B (see FIG. 7A). The input-side lens system 40 includes a third lens 40A and a fourth lens 40B (see FIG. 7A).

Then, the input-side lens system 40 and the input-side optical fiber 5 are disposed on the side of the input end face (one end face) of the SOA chip 3, and the output-side lens system 6 and the output-side optical fiber 7 are disposed on the output-side end face (the other end face) of the SOA chip 3 (see FIG. 7A).

In this embodiment, on the side of the input end face of the SOA chip 3, the third lens 40A is disposed next to the SOA chip 3, the fourth lens 40B is disposed next to the third lens 40A on the side away from the SOA chip 3, and the input-side optical fiber 5 is disposed next to the fourth lens 40B furthest away from the SOA chip 3 (see FIG. 7A).

On the side of the output end face of the SOA chip 3, the first lens 6A is disposed next to the SOA chip 3, the second lens 6B is disposed next to the first lens 6A on the side away from the SOA chip 3, and the output-side optical fiber 7 is disposed next to the second lens 6B furthest away from the SOA chip 3 (see FIG. 7A).

As in the first embodiment described above (see FIG. 2), the positions of the input-side lens system 40, the output-side lens system 6, the input-side optical fiber 5 and the output-side optical fiber 7 are adjusted to increase the power of the light coupled from the end faces of the SOA chip 3 to the input-side optical fiber 5 and the output-side optical fiber 7 via the input-side lens system 40 and the output-side lens system 6, respectively (that is, to reduce the optical coupling loss).

In this embodiment, as in the first embodiment described above (see FIG. 2), by applying a current to the SOA chip 3 to make the SOA chip 3 emit ASE light from the end faces, the positions of the first lens 6A, the second lens 6B, and the output-side optical fiber 7 are adjusted to increase the power of the light coupled to the output-side optical fiber 7 via the first lens 6A and the second lens 6B in the output-side lens system 6.

Similarly, the positions of the third lens 40A, the fourth lens 40B and the input-side optical fiber 5 are adjusted to increase the power of the light coupled to the input-side optical fiber 5 via the third lens 40A and the fourth lens 40B in the input-side lens system 40.

After the positions are adjusted, the fourth lens 40B, the input-side optical fiber 5, the second lens 6B, and the optical-side optical fiber 7 are fixed.

In this embodiment, after the positions are adjusted based on the optical power as described above, positional adjustment is carried out by displacing the input-side lens system 40 (the third lens 40A in this embodiment) and the output-side lens system 6 (the first lens 6A in this embodiment) in the optical axis direction so that the inter-polarization difference in optical coupling loss between the SOA chip 3 and the input-side optical fiber 5 and the inter-polarization difference in optical coupling loss between the SOA chip 3 and the output-side optical fiber 7 are suitable for compensation for the PDG of the SOA chip 3 (see FIG. 3A).

That is, in this embodiment, in the optical coupling adjustment process (lens system adjustment process) during manufacture of the SOA module, the third lens 40A and the first lens 6A that have been adjusted in position to reduce the optical coupling loss as described above are intentionally shifted in the optical axis direction (see FIG. 3A).

For example, even if the focal position of the output-side lens system 6 has been adjusted to the output end face of the SOA chip 3 by the first positional adjustment of the output-side lens system 6 described above (see the position depicted by the solid line in FIG. 3A), the focal position of the output-side lens system 6 is shifted from the position of the output end face of the SOA chip 3 by the second positional adjustment of the output-side lens system 6 (see the position depicted by the broken line in FIG. 3A). Similarly, even if the focal position of the input-side lens system 40 has been adjusted to the input end face of the SOA chip 3 by the first positional adjustment of the input-side lens system 40 described above, the focal position of the input-side lens system 40 is shifted from the position of the input end face of the SOA chip 3 by the second positional adjustment of the input-side lens system 40.

As a result, an optical coupling loss may occur in the SOA module 1. However, the inter-polarization difference in optical coupling loss between the SOA chip 3 and the input-side optical fiber 5 and the inter-polarization difference in optical coupling loss between the SOA chip 3 and the output-side optical fiber 7 can be adjusted.

After the positional adjustment based on the PDG of the SOA chip 3 is carried out, the third lens 40A and the first lens 6A are fixed.

In this way, a polarization-independent SOA module that provides a polarization-independent optical gain, which is one of the optical amplification characteristics of the part of the module 1 between the input-side optical fiber 5 and the output-side optical fiber 7, can be manufactured.

In the following, an example of the manufacturing method for the SOA module according to the present invention will be described with reference to FIGS. 7A to 7C and 8.

First, as in the first embodiment described above, as illustrated in FIG. 7A, the SOA chip 3 is fixed on a stage (a temperature-controllable stage) 8, and electrical wiring to energize the SOA chip 3 is installed. A current is supplied to the SOA chip 3 to make the SOA chip 3 emit ASE light (amplified spontaneous emission light) from the opposite end faces (A10 in FIG. 8).

Then, as illustrated in FIG. 7A, positional adjustment of the optical system is carried out to reduce the optical coupling loss between the SOA chip 3 and the input-side optical fiber 5 and the output-side optical fiber 7.

Figure 8:
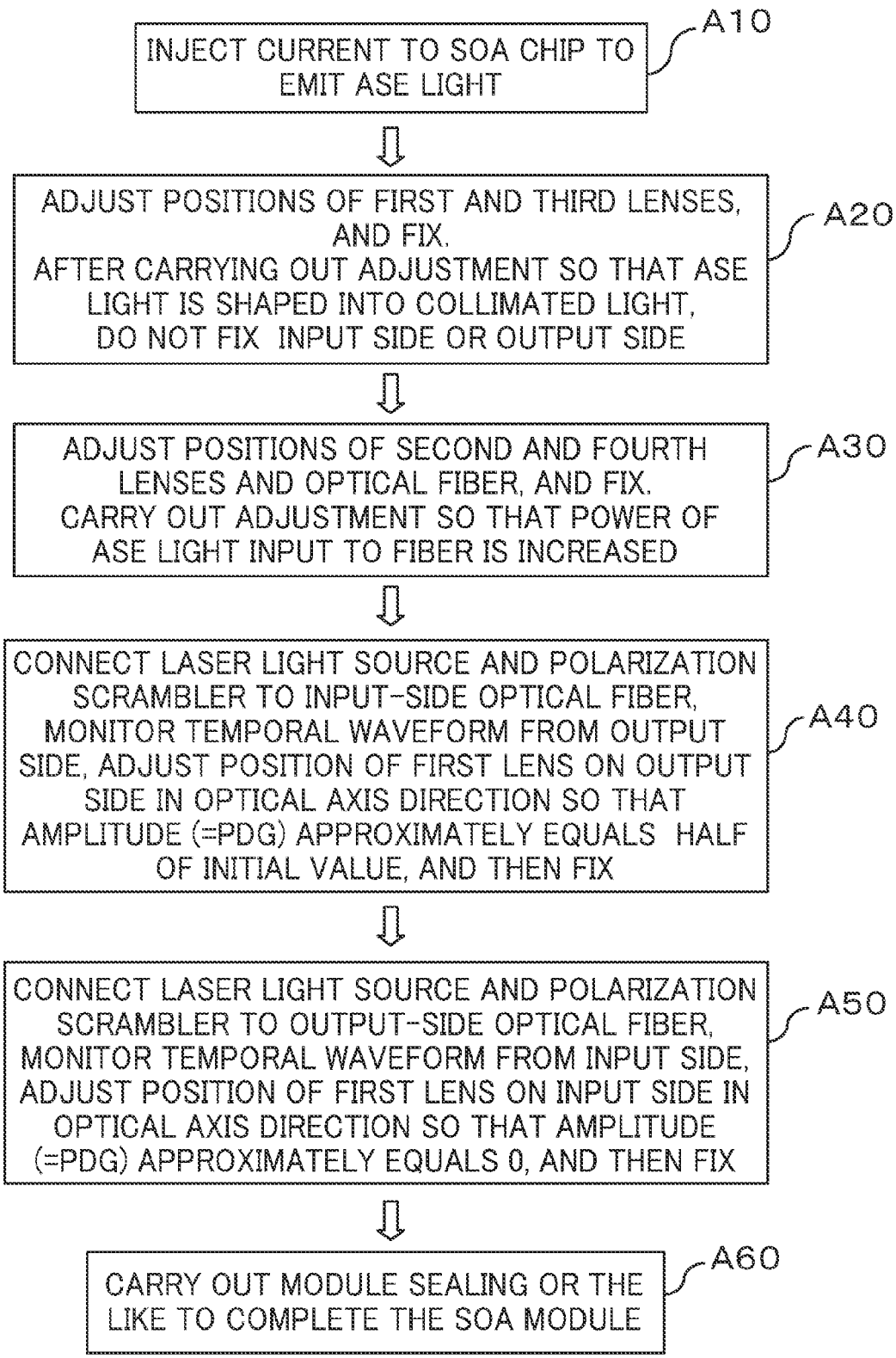
FIG. 8 is a flowchart illustrating processes of the manufacturing method for the optical semiconductor device (SOA module) according to the second embodiment of the present invention.

First, as illustrated in FIG. 7A, the first lens 6A in the output-side lens system 6 is temporarily positioned, and the position of the first lens 6A is adjusted so that the ASE light emitted from one end face of the SOA chip 3 is changed into collimated light by passing through the first lens 6A (A20 in FIG. 8). In A20, the first lens 6A is not fixed.

Similarly, as illustrated in FIG. 7A, the third lens 40A in the input-side lens system 40 is temporarily positioned, and the position of the third lens 40A is adjusted so that the ASE light emitted from the other end face of the SOA chip 3 is changed into collimated light by passing through the third lens 40A (A20 in FIG. 8). In the A20, the third lens 40A is not fixed.

Then, as illustrated in FIG. 7A, the second lens 6B in the output-side lens system 6 and the output-side optical fiber 7 are temporarily positioned, the positions of the second lens 6B and the output-side optical fiber 7 are adjusted so that the collimated light formed by passing through the first lens 6A is optically coupled to the output-side optical fiber 7 with high efficiency, and then, these components are fixed (A30 in FIG. 8).

As illustrated in FIG. 7A, for example, the optical power meter 9 is connected to the output-side optical fiber 7, the positions of the second lens 6B and the output-side optical fiber 7 are adjusted to increase the intensity (power) of the ASE light introduced into the output-side optical fiber 7 by monitoring the intensity of the ASE light with the optical power meter 9, and then, the second lens 6B and the output-side optical fiber 7 are fixed (A30 in FIG. 8).

Similarly, as illustrated in FIG. 7A, the fourth lens 40B in the input-side lens system 40 and the input-side optical fiber 5 are temporarily positioned, the positions of the fourth lens 40B and the input-side optical fiber 5 are adjusted so that the collimated light formed by passing through the third lens 40A is optically coupled to the input-side optical fiber 5 with high efficiency, and then, these components are fixed (A30 in FIG. 8).

As illustrated in FIG. 7A, for example, the optical power meter 9 is connected to the input-side optical fiber 5, the positions of the fourth lens 40B and the input-side optical fiber 5 are adjusted to increase the intensity (power) of the ASE light introduced into the input-side optical fiber 5 by monitoring the intensity of the ASE light with the optical power meter 9, and then, the fourth lens 40B and the input-side optical fiber 5 are fixed (A30 in FIG. 8).

In this way, the SOA chip 3 is optically coupled to the input-side optical fiber 5 and the output-side optical fiber 7 via the input-side lens system 40 and the output-side lens system 6, respectively, in such a manner that the power of the ASE light coupled from the opposite end faces of the SOA chip 3 to the input-side optical fiber 5 and the output-side optical fiber 7 via the input-side lens system 40 and the output-side lens system 6, respectively, is increased.

Note that the procedure of adjusting the lens systems 40 and 6 is not limited to the procedure described above and may vary with the lens systems used.

After the positional adjustment to increase the power of the ASE light (positional adjustment based on the optical power) is carried out as described above, further positional adjustment based on the PDG of the SOA chip 3 is carried out as described below.

Positional adjustment is carried out by displacing the third lens 40A in the input-side lens system 40 and the first lens 6A in the output-side lens system 6 in the optical axis direction so that the inter-polarization difference in optical coupling loss between the SOA chip 3 and the input-side optical fiber 5 and the inter-polarization difference in optical coupling loss between the SOA chip 3 and the output-side optical fiber 7 are suitable for compensation for the PDG of the SOA chip 3 (steps A40 and A50 in FIG. 8).

Note that, to enable such positional adjustment, the third lens 40A in the input-side lens system 40 and the first lens 6A in the output-side lens system 6 are not fixed, while the fourth lens 40B in the input-side lens system 40, the input-side optical fiber 5, the second lens 6B in the output-side lens system 6, and the output-side optical fiber 7 are fixed by YAG welding, UV resin or the like, as described above.

Specifically, the positional adjustment is carried out as follows.

Figure 7B:
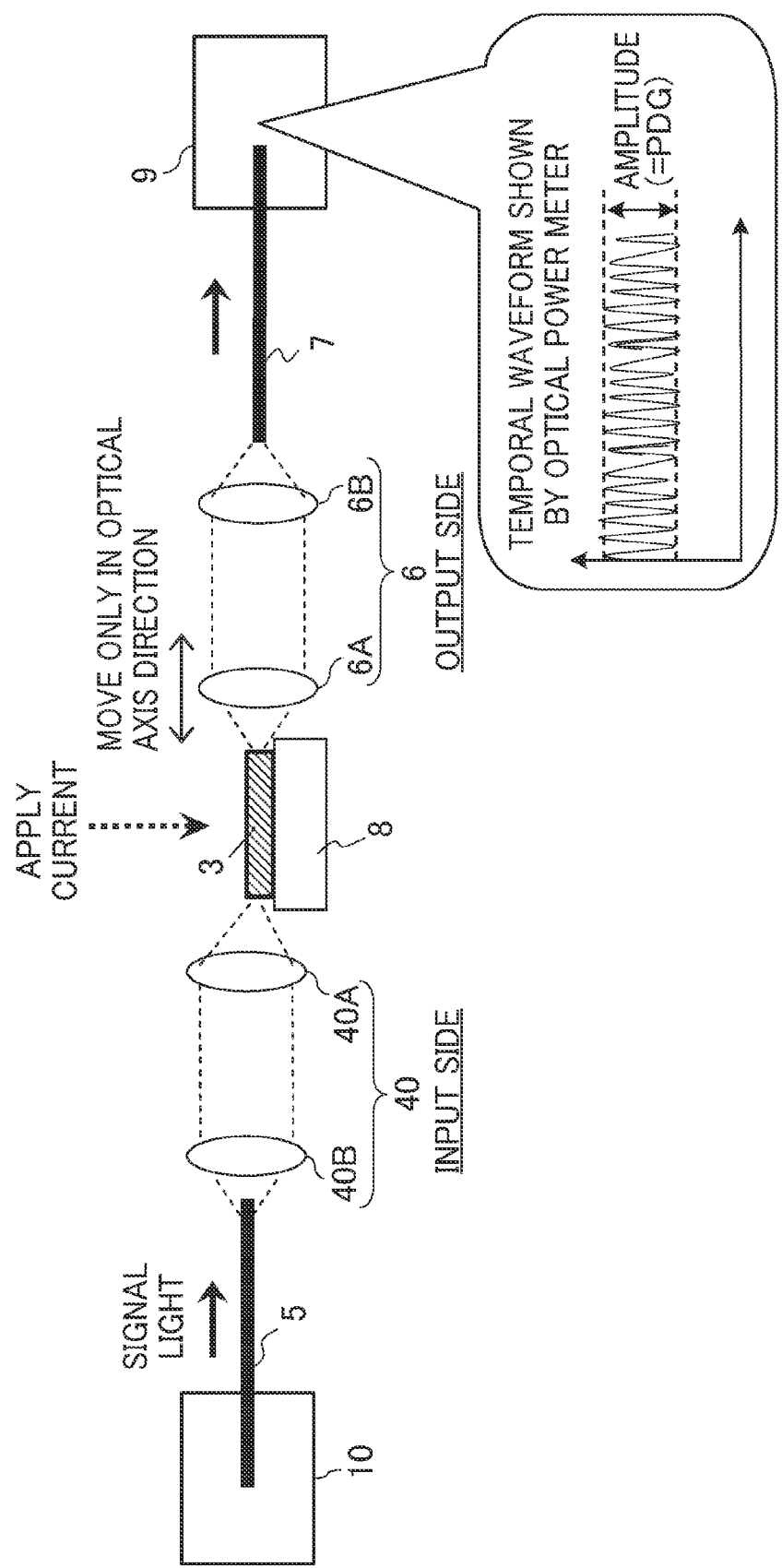

As illustrated in FIG. 7B, the optical power meter 9 is removed from the input-side optical fiber 5, and a laser light source/polarization scrambler 10 is connected to the input-side optical fiber 5, for example (A40 in FIG. 8).

Then, polarization-scrambled signal light, which includes light in optical waveguide modes differing in the direction of polarization by changing the polarization state of the signal light over time, is input from the laser light source/polarization scrambler 10 to the temporarily assembled SOA module 1 via the input-side optical fiber 5 (A40 in FIG. 8).

The polarization-scrambled signal light is input to the SOA chip 3 via the input-side optical fiber 5 and the input-side lens system 40, amplified in the SOA chip 3 to which a current is supplied, and then output to the optical power meter 9 connected to the output-side optical fiber 7 via the output-side lens system 6 and the output-side optical fiber 7.

As illustrated in FIG. 7B, the optical power meter 9 connected to the output-side optical fiber 7 monitors the temporal waveform of the intensity of the signal light amplified in the SOA chip 3 and output from the SOA module 1 (the power of the output signal light) (A40 in FIG. 8).

Then, while monitoring the temporal waveform displayed by the optical power meter 9, positional adjustment is carried out by displacing the first lens 6A in the output-side lens system 6 in the optical axis direction (that is, by changing the relationship between the beam waist position and the position of the output end face of the SOA chip 3) so that the peak to peak amplitude of the temporal waveform substantially equals half of an initial value, for example, and then, the first lens 6A is fixed (A40 in FIG. 8).

Figure 7C:
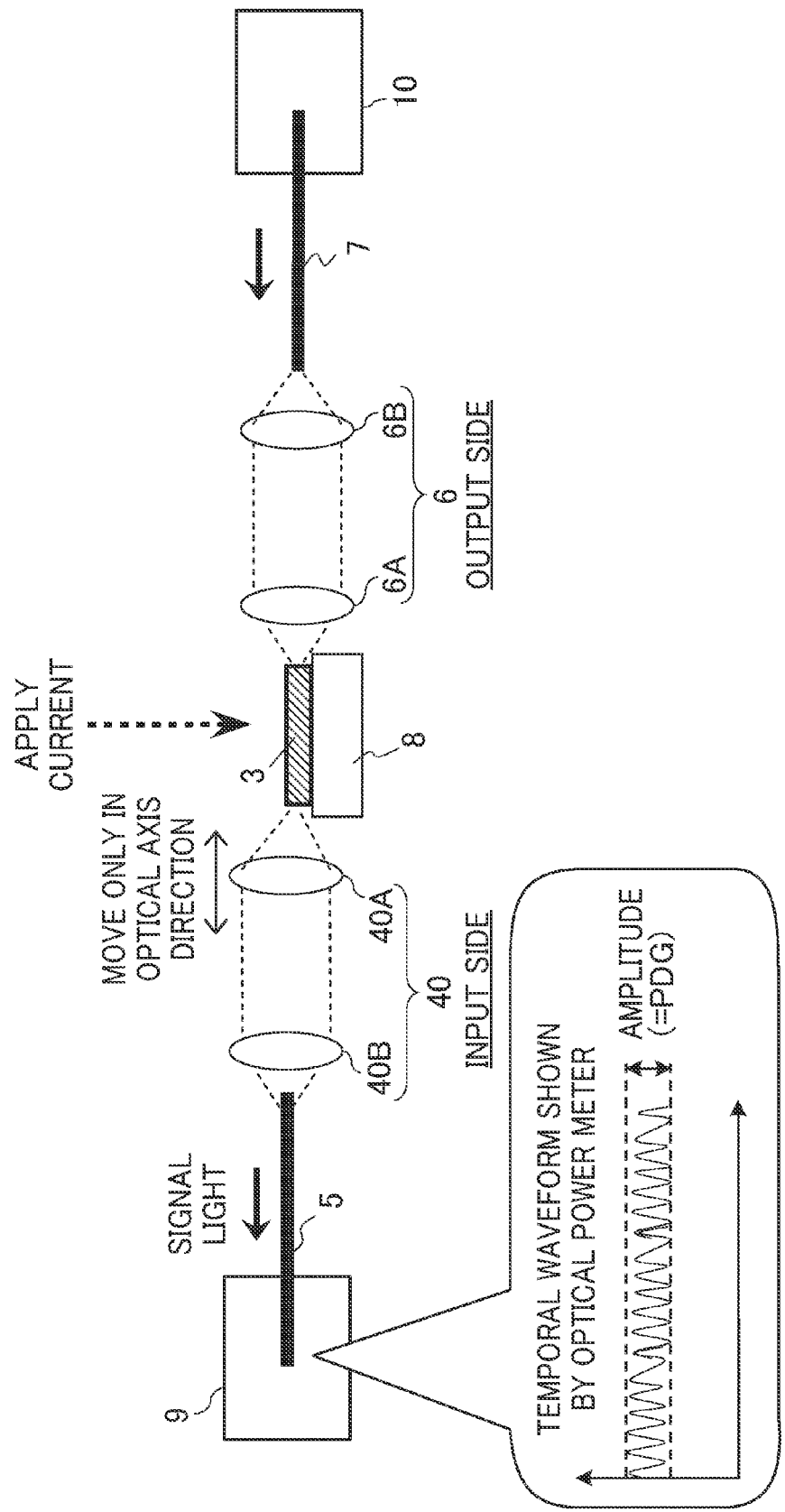

Then, to reverse the direction of inputting light and introduce the signal light from the output side, as illustrated in FIG. 7C, the laser light source/polarization scrambler 10 connected to the input-side optical fiber 5 is removed, and the optical power meter 9 is connected to the input-side optical fiber 5. In addition, the optical power meter 9 connected to the output-side optical fiber 7 is removed, and the laser light source/polarization scrambler 10 is connected to the output-side optical fiber 7 (A50 in FIG. 8).

Then, polarization-scrambled signal light (including light in optical waveguide modes differing in the direction of polarization) is input from the laser light source/polarization scrambler 10 to the temporarily assembled SOA module 1 via the output-side optical fiber 7 (A50 in FIG. 8).

The polarization-scrambled signal light is input to the SOA chip 3 via the output-side optical fiber 7 and the output-side lens system 6, amplified in the SOA chip 3 to which a current is supplied, and then output to the optical power meter 9 connected to the input-side optical fiber 5 via the input-side lens system 40 and the input-side optical fiber 5.

As illustrated in FIG. 7C, the optical power meter 9 connected to the input-side optical fiber 5 monitors the temporal waveform of the intensity of the signal light amplified in the SOA chip 3 and output from the SOA module 1 (the power of the output signal light) (A50 in FIG. 8).

Then, while monitoring the temporal waveform displayed by the optical power meter 9, positional adjustment is carried out by displacing the third lens 40A in the input-side lens system 40 in the optical axis direction (by changing the relationship between the beam waist position and the position of the input end face of the SOA chip 3) so that the amplitude of the temporal waveform approximately equals 0 (that is, the PDG is substantially 0), and then, the third lens 40A is fixed (A50 in FIG. 8). In summary, the signal light (including light in optical waveguide modes differing in the direction of polarization) output from the SOA chip 3 via the input-side lens system 40 is detected, and the third lens 40A is repositioned at a location where the PDG is reduced based on the detected light.

By such positional adjustment, the variations of the PDG of the SOA chip 3 can be compensated for based on the inter-polarization difference in optical coupling loss added equally to the input side and the output side (the inter-polarization difference in optical coupling loss between the SOA chip 3 and the input-side optical fiber 5 and the inter-polarization difference in optical coupling loss between the SOA chip 3 and the output-side optical fiber 7).

Then, sealing of the module or the like is carried out to complete the SOA module 1 according to this embodiment (A60 in FIG. 8).

The remaining details are the same as those in the first embodiment described earlier, and therefore, descriptions thereof will be omitted.

The SOA module 1 manufactured as described above has the configuration described below.

In the SOA module 1 according to this embodiment, both the input-side lens system 40 and the output-side lens system are 6 are configured to provide a spot size at the beam waist position smaller than the spot size in any of the optical waveguide modes.

In addition, both the input-side lens system 40 and the output-side lens system 6 are positioned so that the inter-polarization difference in optical coupling loss is suitable for compensation for the polarization dependent gain of the SOA chip 3. That is, the lens systems 40 and 6 are each positioned at a location where the lens systems 40 and 6 are displaced in the optical axis direction from the location where the distance between the lens systems 40 and 6 and the end face of the SOA chip 3 is equal to the focal length of the lens systems 40 and 6.

In particular, in this embodiment, an equal inter-polarization difference in optical coupling loss is added to the input side and the output side of the SOA module 1.

In this way, both the lens systems 40 and 6 are positioned so that the spot sizes of the beams condensed by the lens systems 40 and 6 on the end faces of the SOA chip 3 are smaller than the spot sizes in both of the optical waveguide modes or smaller than the spot size in either of the optical waveguide modes.

The remaining details are the same as those in the first embodiment described earlier, and therefore, descriptions thereof will be omitted.

In summary, the manufacturing method for an optical semiconductor device (optical module) and the optical module according to this embodiment have an advantage that a stable polarization-independent optical gain can be achieved even when the PDG of the SOA chip 3 varies.

In particular, this embodiment has an advantage that the SOA module 1 whose characteristics do not vary with the direction of the input light is provided since the inter-polarization difference in optical coupling loss is added substantially equally to the input side and the output side of the SOA module 1.

In the embodiment described above, positional adjustment is carried out so that the amplitude of the temporal waveform substantially equals half of the initial value by displacing the first lens 6A in the output-side lens system 6 only in the optical axis direction, and then, further positional adjustment is carried out so that the amplitude of the temporal waveform approximately equals 0 by displacing the third lens 40A in the input-side lens system 40 only in the optical axis direction. However, the present invention is not limited thereto, and only the variations of the PDG of the SOA chip 3 may be compensated for by the inter-polarization difference in optical coupling loss added to both the input side and the output side of the SOA module 1. For example, positional adjustment may be carried out so that the amplitude of the temporal waveform approximately equals a specific value by displacing the first lens 6A in the output-side lens system 6 only in the optical axis direction, and then, further positional adjustment may be carried out so that the amplitude of the temporal waveform approximately equals 0 by displacing the third lens 40A in the input-side lens system 40 only in the optical axis direction.

In the manufacturing methods for the SOA module according to the embodiments described above, the output-side lens system 6 in the first embodiment and the input-side lens system 40 and the output-side lens system 6 in the second embodiment are configured to provide a spot size at the beam waist position smaller than the spot size in any of the TE mode and the TM mode. However, the present invention is not limited thereto.

For example, in the first embodiment, if the SOA chip 3 can provide significantly different spot sizes on the chip end face in the TE mode and the TM mode, and the PDG of the SOA chip 3 can be compensated for by the inter-polarization difference in optical coupling loss between the SOA chip 3 and the optical fiber 7, the output-side lens system 6 may be a lens system configured to provide a spot size at the beam waist position smaller than the spot size in either of the TE mode and the TM mode.

In addition, for example, in the second embodiment, if the SOA chip 3 can provide significantly different spot sizes on the chip end face in the TE mode and the TM mode, and the PDG of the SOA chip 3 can be compensated for by the inter-polarization difference in optical coupling loss between the SOA chip 3 and the optical fiber 5 and the inter-polarization difference in optical coupling loss between the SOA chip 3 and the optical fiber 7, the input-side lens system 40 and the output-side lens system 6 may be lens systems configured to provide a spot size at the beam waist position smaller than the spot size in either of the TE mode and the TM mode.

In such a case, the SOA module manufactured by the manufacturing method according to the embodiments described above is configured so that the output-side lens system 6 in the first embodiment (or the input-side lens system 40 and the output-side lens system 6 in the second embodiment) provides a spot size at the beam waist position smaller than the spot size in either of the optical waveguide modes.

In addition, in the embodiments described above, the lens disposed at a position closest to the end face of the SOA chip 3 (the first lens 6A in the first embodiment, and the first lens 6A and the third lens 40A in the second embodiment) is not fixed when the first lens position adjustment carried out to increase the intensity of the ASE light and is displaced only in the optical axis direction when the second lens position adjustment for adjusting the PDG is carried out.

In this case, to prevent the lens 6A (40A) from moving in two directions orthogonal to the optical axis (directions in the vertical plane) when the lens 6A (40A) is displaced in the optical axis direction, separate fixing mechanisms for the optical axis direction and the two orthogonal directions are preferably provided.

For example, a lens jig capable of moving the lens 6A (40A) in the optical axis direction and fixing the lens 6A (40A) in the two directions orthogonal to the optical axis direction can be used.

Figure 9A:
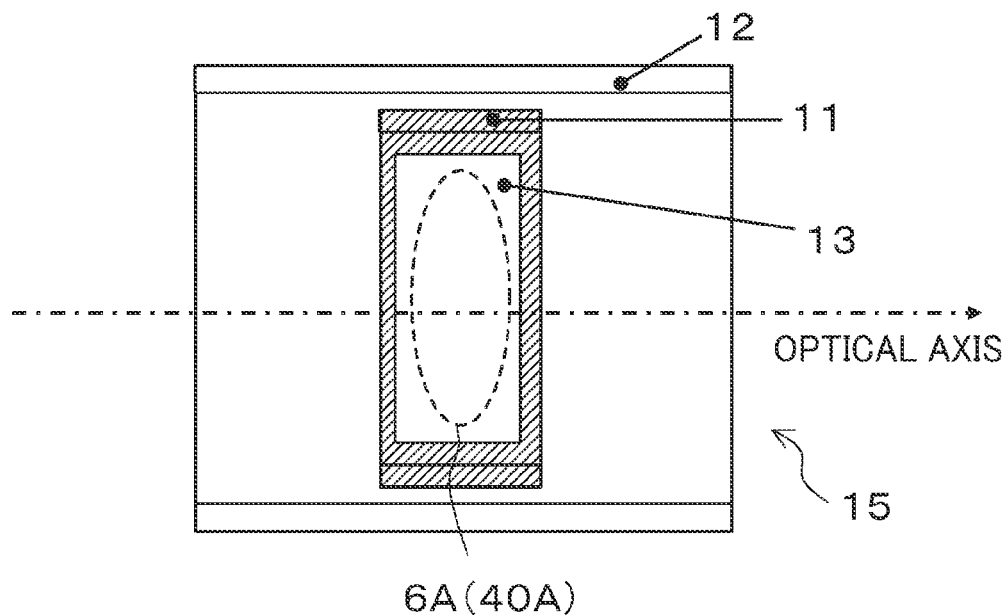
FIGS. 9A and 9B are diagrams illustrating a lens jig used in the manufacturing methods for the optical semiconductor device (SOA module) according to the embodiments of the present invention.
Figure 9B:
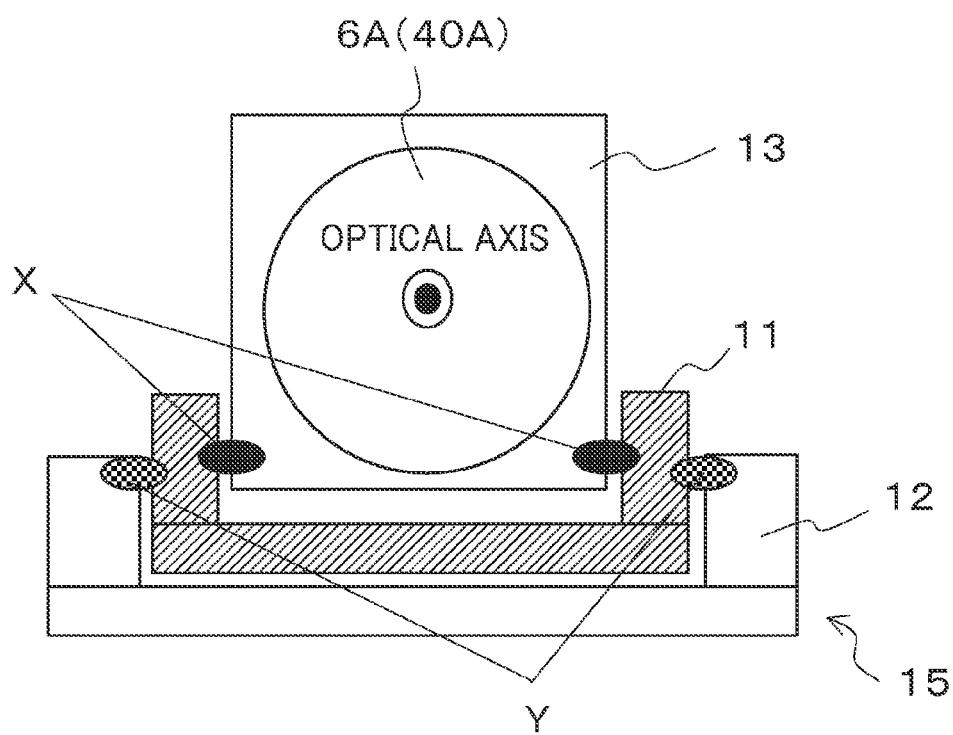

For example, as illustrated in FIGS. 9A and 9B, a lens jig 15 having a first guide member 11 capable of guiding the lens 6A (40A) in the vertical direction orthogonal to the optical axis direction and a second guide member 12 capable of guiding the first guide member 11 in the optical axis direction can be used. In this case, the lens 6A (40A) is fixed on a lens holder 13. In addition, the second guide member 12 is fixed on the stage 8 (see FIG. 1).

Using a lens jig 15, the lens 6A (40A) is preferably fixed after the first lens position adjustment in such a manner that the lens 6A (40A) can move in the optical axis direction but cannot move in the two directions orthogonal to the optical axis direction.

That is, when the lens holder 13 to which the lens 6A (40A) is fixed is moved in the vertical direction orthogonal to the optical axis direction in the first lens position adjustment, the lens holder 13 to which the lens 6A (40A) is fixed can be adjusted in the orthogonal directions to the optical axis using the first guide member 11. After the lens position adjustment in the vertical direction orthogonal to the optical axis direction, the inner surface of the side wall of the first guide member 11 and the side surface of the lens holder 13 are fixed to each other by welding, resin or the like as depicted by reference character X in FIG. 9B.

In this way, in the second lens position adjustment for adjusting the PDG, an accidental displacement of the lens in the two directions orthogonal to the optical axis direction can be prevented, so that the SOA module 1 manufactured can have a further reduced coupling loss.

In FIGS. 9A and 9B, for clarity of explanation, clearances are illustrated between the side surface of the lens holder 13 and the inner surface of the side wall of the first guide member 11 and between the outer surface of the side wall of the first guide member 11 and the inner surface of the side wall of the second guide member 12. However, the actual clearance may be very small. Therefore, lens position adjustment in the orthogonal plane direction to the optical axis can be achieved by fixing the second guide member 12 on the stage 8 (see FIG. 1), mounting the first guide member 11 on the second guide member 12, and mounting the lens holder 13 on the first guide member 11.

Then, when the lens holder 13 to which the lens 6A (40A) is fixed is moved in the optical axis direction in the lens position adjustment for adjusting the PDG, the second guide member 12 guides the first guide member 11 to which the lens holder 13 is fixed, only in the optical axis direction. Note that, in advance, the second guide member 12 is fixed to the stage 8 in a way that the direction of the side wall of the second guide member 12 (horizontal side wall of 12 in FIG. 9A) is adjusted to be parallel to the optical axis. Then, after the lens position adjustment in the optical axis direction, the inner surface of the side wall of the second guide member 12 and the outer surface of the side wall of the first guide member 11 are fixed to each other by welding, resin or the like as depicted by reference character Y in FIG. 9B.

The SOA module 1 manufactured using the lens jig 15 includes the first guide member 11 and the second guide member 12. The lens 6A (40A) disposed at a position closest to the end face of the SOA chip 3 is fixed to the first guide member 11, and the first guide member 11 is fixed to the second guide member 12.

In addition, the configuration of the SOA module 1 for each embodiment described above can be varied.

For example, the spot size provided by the SOA chip 3 and the spot sizes provided at the beam waist position by the lens systems 40 and 6 in the embodiments described above are not limited to the values described in the embodiments and may have other values.

In addition, the manufacturing procedure and configuration of the module 1 are not limited to those in the embodiments described above.

In addition, in the embodiments described above, as illustrated in FIG. 10, the SOA module 1 may have an SOA chip (a semiconductor device, an integrated device, an optical device) 30 integrated with a spot size transformer 16 in the vicinity of an end face thereof. Note that FIG. 10 illustrates only the output-side part of the SOA chip including the output-side end face.

In this example, as illustrated in FIG. 10, the spot size transformer 16 is an optical waveguide formed to be seam- lessly connected to an optical waveguide (SOA optical waveguide) 30B forming an SOA part 30A of the SOA chip 30, and the optical waveguide is a tapered optical waveguide whose width is gradually reduced toward the chip end face (element end face) (a tapered width spot size transformer).

Note that the configuration of the spot size transformer 16 is not limited to the configuration described above. For example, the spot size transformer 16 may be a tapered optical waveguide whose thickness is gradually reduced (a tapered thickness spot size transformer).

By using such a SOA chip 30, the spot size on the end face of the SOA chip 30 in the TE mode and the TM mode can be adjusted by the design of the spot size transformer independently of the configuration of the SOA optical waveguide 30B.

As a result, the SOA chip 30 whose PDG can be easily adjusted during assembly of the module without degrading the characteristics of the SOA chip 30 (that is, the SOA chip 30 that can provide significantly different spot sizes in the TE mode and the TM mode) can be manufactured, and the SOA module 1 having preferable characteristics can be manufactured.

Note that the spot size transformer 16 may be provided in the vicinity of only one of the end faces of the SOA chip 30 or in the vicinity of the both end faces thereof.

In addition, in the configurations according to the embodiments described above, the SOA module 1 may have one lens on the input side instead of having the input-side lens system. In addition, in the configurations according to the embodiments described above, the SOA module 1 may have one lens on the output side instead of having the output-side lens system.

Figure 11:
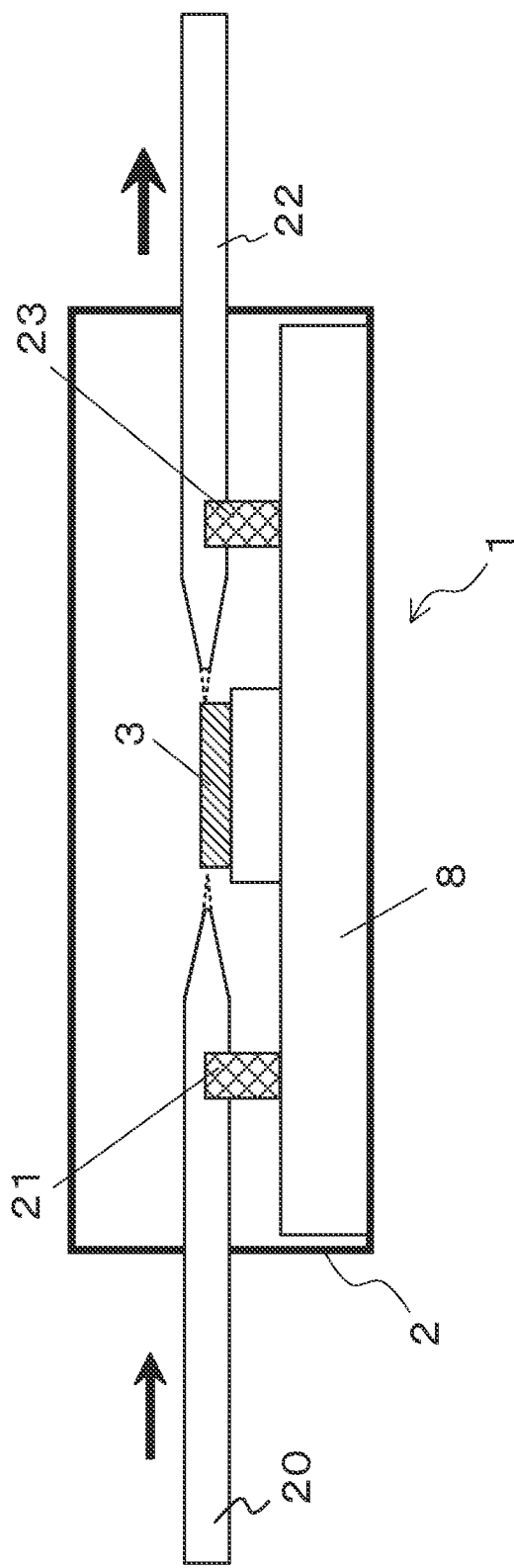
FIG. 11 is a diagram illustrating another configuration of the optical semiconductor device (SOA module) according to the embodiments of the present invention.

In addition, in the configurations according to the embodiments described above, as illustrated in FIG. 11, the SOA module 1 may have an input-side lens fiber 20 that is processed to have a lens-like tip end on the input side instead of having the input-side lens system and the input-side optical fiber and be held by an input-side fiber holder (a connector) 21. Note that, in FIG. 11, the same components as those in the embodiments described above (see FIG. 1) are denoted by the same reference numerals.

In addition, in the configurations according to the embodiments described above, as illustrated in FIG. 11, the SOA module 1 may have an output-side lens fiber 22 on the output side that is processed to have a lens-like tip end instead of the output-side lens system and the output-side optical fiber, and to be held by an output-side fiber holder (a connector) 23.

As described above, the lenses of the SOA module 1 may be formed on an end face of an optical fiber.

In such a case, the spot sizes provided at the beam waist position by the lens fiber 20 and 22 may be changed by changing the radius of curvature of the lens formed on the tip end of the lens fiber.

Figure 12:
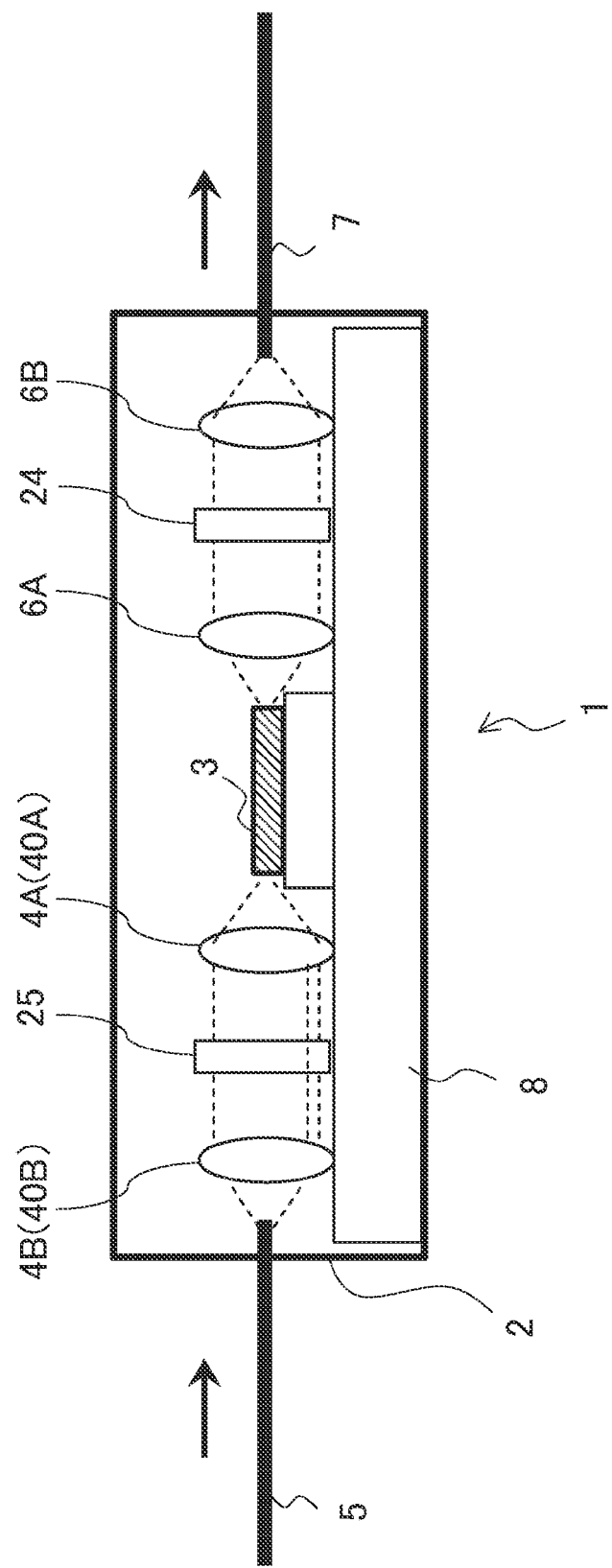
FIG. 12 is a diagram illustrating another configuration of the optical semiconductor device (SOA module) according to the embodiments of the present invention.

In addition, in the configurations according to the embodiments described above, as illustrated in FIG. 12, an optical isolator 24 may be interposed between the first lens 6A and the second lens 6B to reduce the reflected light. Similarly, as illustrated in FIG. 12, an optical isolator 25 may be interposed between the third lens 4A (40A) and the fourth lens 4B (40B) to reduce the reflected light. The optical isolators 24 and 25 are preferably disposed between the SOA chip 3 and the optical fiber 7 and between the SOA chip 3 and the optical fiber 5.

In addition, in the embodiments described above, the SOA module 1 has been described as having the optical fibers 5 and 7. However, the present invention is not limited thereto. For example, the SOA module 1 may have a holder (connector) to which an optical fiber is connected. In such a case, in the manufacturing methods described above, in adjusting the position of the optical fiber, the position of the connector of the SOA module (optical module) can be adjusted.

Figure 13:
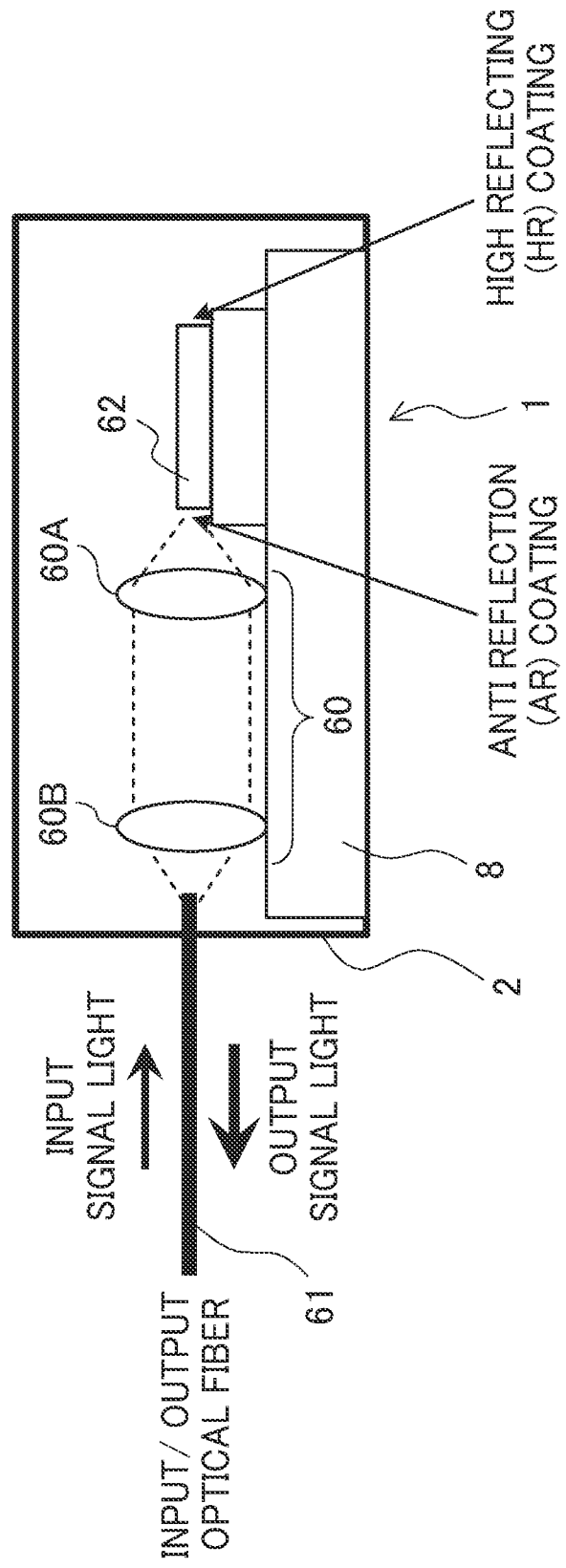
FIG. 13 is a diagram illustrating another configuration of the optical semiconductor device (SOA module) according to the embodiments of the present invention.

In addition, in the embodiments described above, the present invention may be applied to an SOA module using a transmission-type SOA chip as the SOA chip 3, for example. However, the present invention is not limited thereto. For example, the present invention can equally be applied to the SOA module 1 using a reflection-type SOA chip 62 as illustrated in FIG. 13. Note that, in FIG. 13, the same components as those in the embodiments described above (see FIG. 1) are denoted by the same reference numerals.

The transmission-type SOA chip 3 in the embodiments described above has an anti reflection (AR) coating on both the end faces thereof. However, as illustrated in FIG. 13, the reflection-type SOA chip 62 may have a high reflecting (HR) coating on one end face, although the reflection-type SOA chip 62 may not have an anti-reflection (AR) coating on the other end face as with the transmission-type SOA chip 3.

In the case of such a reflection-type SOA chip 62, signal light is input to the end face with the AR coating, amplified while propagating through the device in one direction, reflected from the end face with the HR coating, amplified while propagating through the device in the opposite direction, and then output from the end face with the AR coating.

Thus, the SOA module 1 with the reflection-type SOA chip 62 has an input/output lens system 60 and an input/output optical fiber 61 only on the side of the end face with the AR coating. In this example, the lens system 60 includes a first lens 60A and a second lens 60B.

In the case of such an SOA module 1, signal light input to the input/output optical fiber 61 is amplified and reflected in the reflection-type SOA chip 62, and output from the same input/output optical fiber 61 in the opposite direction.

In this case, an SOA chip that provides different spot sizes on the end face with the AR coating for optical waveguide modes differing in the direction of polarization is prepared as the reflection-type SOA chip 62. The SOA chip has different gains in optical waveguide modes differing in the direction of polarization.

In addition, a lens system that provides a spot size at the beam waist position smaller than the spot size on the end face of the reflection-type SOA chip 62 in each of the optical waveguide modes is prepared as the input/output lens system 60.

On the side of the end face with the AR coating of the reflection-type SOA chip 62, the first lens 60A is disposed next to the reflection-type SOA chip 62, the second lens 60B is disposed next to the first lens 60A, and the input/output optical fiber 61 is disposed next to the second lens 60B.

Then, after the positions of the input/output lens system 60 and the input/output optical fiber 61 are adjusted to reduce the optical coupling loss, further positional adjustment can be carried out based on the PDG of the reflection-type SOA chip 62 to correct the PDG of the reflection-type SOA chip 62. In this way, the SOA module 1 that has a constantly low PDG can be manufactured.

In addition, in the embodiments described above, the SOA module 1 having the SOA chip 3 has been taken as an example. However, the present invention is not limited thereto and can be applied to a wide variety of optical semiconductor devices (optical modules) that have a semiconductor element (optical element) that provides different spot sizes on the end face for optical waveguide modes differing in the direction of polarization and slightly different gains or losses in optical waveguide modes differing in the direction of polarization. By application of the present invention, the PDG or PDL of the semiconductor element can be compensated for, and stable polarization-independent characteristics can be achieved even when the PDG or PDL of the semiconductor element varies.

Figure 14:
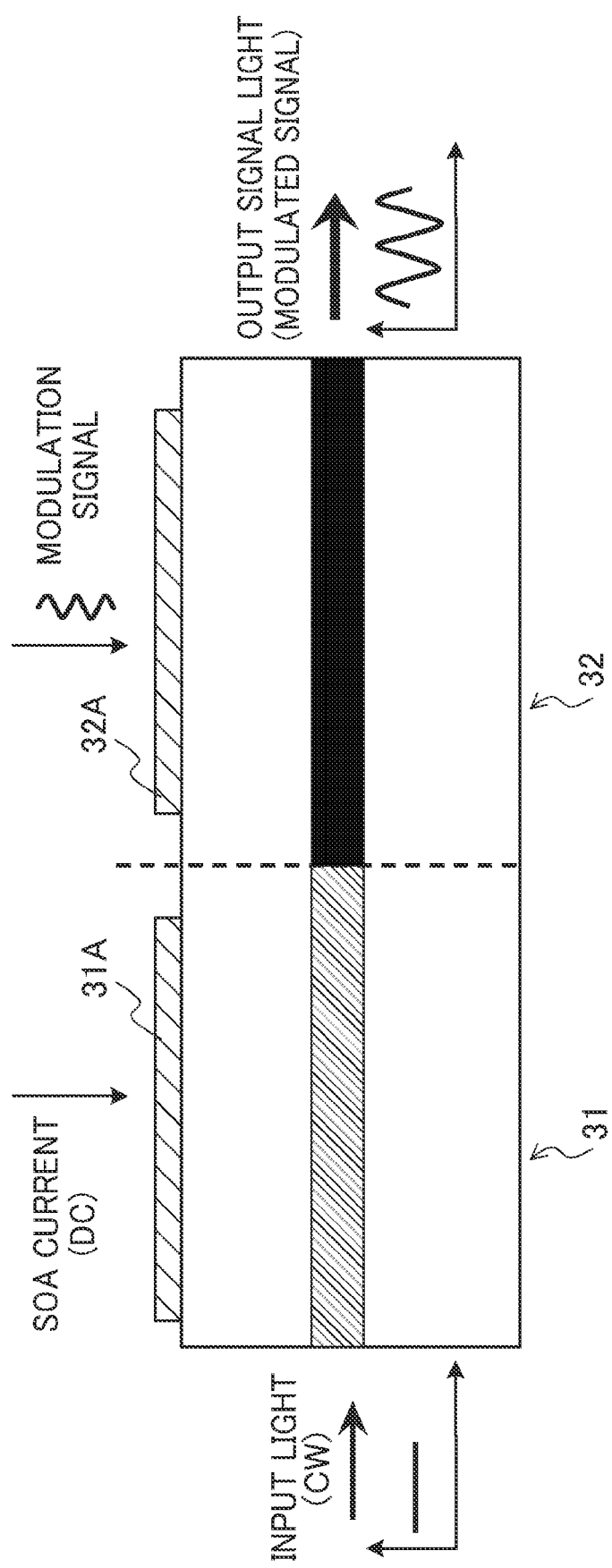
FIG. 14 is a diagram illustrating another configuration of the semiconductor element of the optical semiconductor device (SOA module) according to the embodiments of the present invention.

For example, as illustrated in FIG. 14, the present invention can be applied to an optical module (e.g., a semiconductor optical integrated element module, an optical semiconductor device) that has an integrated element (e.g., an integrated semiconductor optical function element, a semiconductor element, an optical element) including an SOA 31 corresponding to the SOA chip 3 in the embodiments described above, and an optical function element 32 (e.g., an electroabsorption (EA) optical modulator, in this example) such as a laser light source or an optical modulator, which are integrated on the same substrate (a single substrate), as the optical semiconductor device (optical module) having a semiconductor element that provides different spot sizes on the end face for optical waveguide modes differing in the direction of polarization, and slightly different gains or losses in optical waveguide modes differing in the direction of polarization. In this case, the PDG or PDL of the integrated element 33 can be compensated for, and stable polarization-independent characteristics can be achieved even when the PDG or PDL of the semiconductor element varies.

For example, in the case of the integrated element comprising the SOA 31 corresponding to the SOA chip 3 in each embodiment described above and the optical function element 32 (e.g., EA modulator) integrated on the same substrate illustrated in FIG. 14, a current (e.g., an SOA current, DC) is supplied to the SOA 31 via an electrode 31A, and a modulation signal is supplied to the optical function element 32 (e.g., EA modulator) via an electrode 32A. Continuous light (CW) input to one element end face is amplified by the SOA 31, modulated by the optical function element 32 (e.g., EA modulator) and then output from the other element end face in the form of a modulated signal (signal light).

In addition, the present invention may also be applied to an optical semiconductor device that has an N:1 SOA gate switch element that includes a plurality of SOAs and an N:1 optical coupler integrated with each other, a wavelength switch element comprising a combination of a plurality of SOAs and array waveguide gratings (AWG), or various optical signal processing elements comprising a combination of an SOA, a laser light source and a Mach-Zehnder interferometer, for example.

Figure 15:
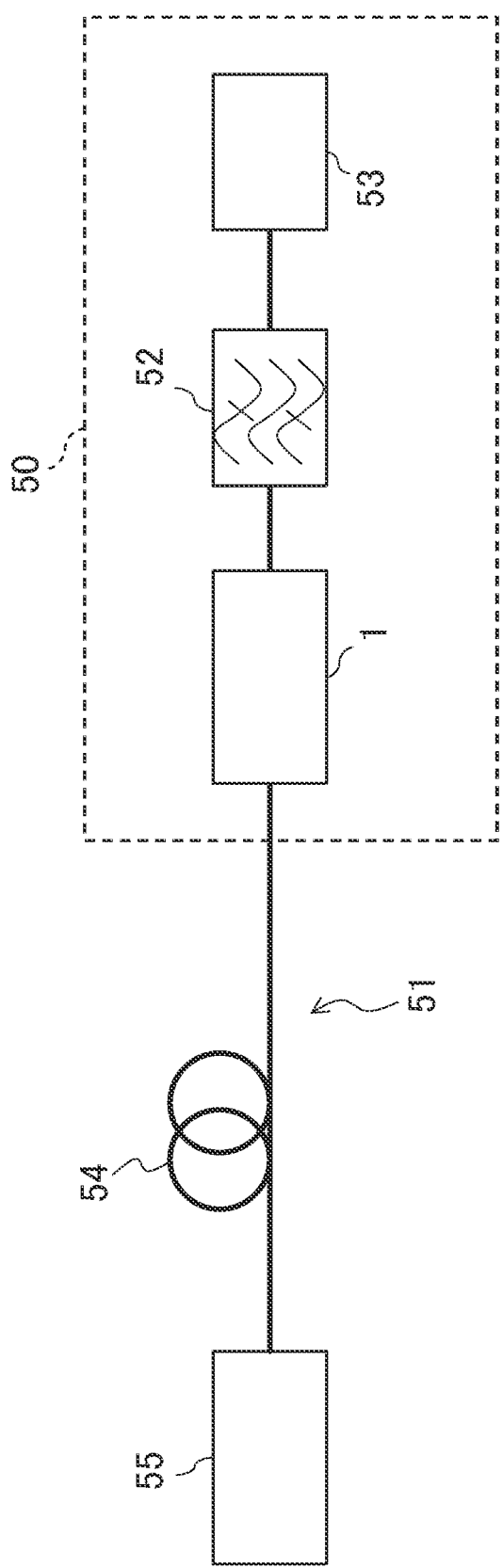
FIG. 15 is a diagram illustrating an optical receiver including the optical semiconductor device (SOA module) according to the embodiments of the present invention and an optical communication system including the optical receiver.

In addition, as illustrated in FIG. 15, for example, the SOA module (optical module) 1 according to each embodiment described above can be used to form an optical receiver 50 or an optical communication system 51.

For example, as illustrated in FIG. 15, the SOA module 1 according to each embodiment described above can be combined with an optical bandpass filter 52, an optical detector 53 and the like to form the optical receiver 50. In this example, the SOA module 1 is placed in front of the optical detector 53 in the optical receiver 50. The SOA module 1 serves as a preamplifier that amplifies the optical signal having been attenuated in an optical transmission path 54 (e.g., an optical fiber transmission path in this example) and forwards the amplified optical signal to the optical detector 53. In this case, the SOA module 1 according to the present invention having a low PDG is particularly useful because the polarization state of the signal light which is transmitted through the optical fiber becomes random and changes over time.

Furthermore, as illustrated in FIG. 15, the optical receiver 50 thus configured can be combined with an optical transmitter 55 to form the optical communication system 51. That is, the optical communication system 51 comprising the optical receiver 50 described above and the optical transmitter 55 connected thereto by the optical transmission path 54 (e.g., optical fiber transmission path in this example) can be provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A manufacturing method for an optical semiconductor device, comprising:
    disposing a semiconductor element that has a polarization dependent gain or a polarization dependent loss between optical waveguide modes differing in a direction of polarization;
    positioning a lens at one end face side of the semiconductor element based on an optical coupling loss between the lens and the semiconductor element;
    repositioning the lens based on the polarization dependent gain or the polarization dependent loss of the semiconductor element,
    wherein a spot size at a beam waist position of the lens is smaller than a spot size in any of the optical waveguide modes in the semiconductor element, and the repositioning of the lens includes:
    inputting light in the optical waveguide modes differing in the direction of polarization to the semiconductor element;
    detecting light in the optical waveguide modes differing in the direction of polarization output from the semiconductor element through the lens; and
    carrying out positional adjustment by displacing the lens in an optical axis direction in such a manner that an amplitude of a temporal waveform of the power of the light detected through the lens approximately equals zero,
    wherein the light in the optical waveguide modes differing in the direction of polarization is polarization-scrambled light.

2. The manufacturing method for an optical semiconductor device according to claim 1, wherein the lens includes a first lens and a second lens, and the positioning of the lens comprises:
    positioning the first lens and the second lens at the one end face side of the semiconductor element front to back in such a manner that the first lens is closer to the semiconductor element than the second lens; and
    fixing the second lens at a position where light passing through the first lens and the second lens forms collimated light.

3. The manufacturing method for an optical semiconductor device according to claim 1, wherein the positioning the lens further comprises:
    positioning another lens at the other end face side of the semiconductor element.

4. The manufacturing method for an optical semiconductor device according to claim 3, wherein the another lens includes a third lens and a fourth lens, and the positioning of the another lens comprises:
    disposing the third lens and the fourth lens front to back in such a manner that the third lens is closer to the semiconductor element than the fourth lens; and
    fixing the fourth lens at a position where light passing through the third lens and the fourth lens forms collimated light.

5. The manufacturing method for an optical semiconductor device according to claim 3, wherein the repositioning of the lens comprises:
    inputting light in the optical waveguide modes differing in the direction of polarization to the semiconductor element through the another lens.

6. The manufacturing method for an optical semiconductor device according to claim 3, wherein the repositioning of the lens further comprises:
    detecting light in the optical waveguide modes differing in the direction of polarization output from the semiconductor element through the another lens; and
    repositioning the another lens based on detected light.

7. The manufacturing method for an optical semiconductor device according to claim 6, wherein the repositioning of the lens comprises:
    inputting light in the optical waveguide modes differing in the direction of polarization to the semiconductor element through the lens.

8. The manufacturing method for an optical semiconductor device according to claim 7, wherein the repositioning of the lens comprises:
    repositioning the lens and the another lens at positions where the polarization dependent gain or the polarization dependent loss of the semiconductor element is reduced.

9. The manufacturing method for an optical semiconductor device according to claim 8, wherein the light in the optical waveguide modes differing in the direction of polarization is polarization-scrambled light, and the repositioning of the lens comprises:
    carrying out positional adjustment by displacing the lens in an optical axis direction in such a manner that the amplitude of a temporal waveform of the power of the light detected through the lens approximately equals a specified value and carrying out positional adjustment by displacing the another lens in the optical axis direction in such a manner that the amplitude of a temporal waveform of the power of the light detected through the another lens approximately equals 0.

10. The manufacturing method for an optical semiconductor device according to claim 1, wherein the lens includes a lens fiber processed to have a lens-like tip end.

11. The manufacturing method for an optical semiconductor device according to claim 3, wherein the another lens includes a lens fiber processed to have a lens-like tip end.

* * * * *